(12) United States Patent
Hsieh et al.

(10) Patent No.: US 8,502,329 B2
(45) Date of Patent: Aug. 6, 2013

(54) MICRO-ELECTRO-MECHANICAL SYSTEMS (MEMS) DEVICE AND METHOD FOR FABRICATING THE SAME

(75) Inventors: Tsung-Min Hsieh, New Taipei (TW); Chien-Hsing Lee, Hsinchu County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 13/224,297

(22) Filed: Sep. 1, 2011

(65) Prior Publication Data

US 2013/0056841 A1    Mar. 7, 2013

(51) Int. Cl.
*H01L 29/84* (2006.01)

(52) U.S. Cl.
USPC ............................................ 257/419; 438/53

(58) Field of Classification Search
USPC ............ 257/418, E21.002, E29.324; 438/53
See application file for complete search history.

(56) References Cited

U.S. PATENT DOCUMENTS

| | | | | |
|---|---|---|---|---|
| 7,795,063 B2 * | 9/2010 | Hsieh et al. | ..................... | 438/53 |
| 8,073,166 B2 * | 12/2011 | Takeuchi et al. | .............. | 381/174 |
| 8,093,119 B2 * | 1/2012 | Hsieh et al. | ................... | 438/199 |
| 2009/0166772 A1 * | 7/2009 | Hsieh et al. | ................... | 257/415 |
| 2010/0330722 A1 * | 12/2010 | Hsieh et al. | ..................... | 438/53 |
| 2012/0090398 A1 * | 4/2012 | Lee et al. | ........................ | 73/715 |

* cited by examiner

*Primary Examiner* — Thao P. Le
(74) *Attorney, Agent, or Firm* — Jianq Chyun IP Office

(57) ABSTRACT

A MEMS device includes a substrate. The substrate has a plurality of through holes in the substrate within a diaphragm region and optionally an indent space from the second surface at the diaphragm region. A first dielectric structural layer is then disposed over the substrate from the first surface, wherein the first dielectric structural layer has a plurality of openings corresponding to the through holes, wherein each of the through holes remains exposed by the first dielectric structural layer. A second dielectric structural layer with a chamber is disposed over the first dielectric structural layer, wherein the chamber exposes the openings of the first dielectric structural layer and the through holes of the substrate to connect to the indent space. A MEMS diaphragm is embedded in the second dielectric structural layer above the chamber, wherein an air gap is formed between the substrate and the MEMS diaphragm.

28 Claims, 33 Drawing Sheets

MICRO-ELECTRO-MECHANICAL SYSTEMS (MEMS) DEVICE AND METHOD FOR FABRICATING THE SAME

BACKGROUND OF THE INVENTION

1. Field of Invention

The present invention relates to Micro-Electro-Mechanical Systems (MEMS) device. More particularly, the present invention relates to the structure and fabrication method for MEMS device with improved sensing capability.

2. Description of Related Art

MEMS device, such as MEMS microphone, has been popular gradually due to the excellent features comparing to the conventional ECM microphone. The features of MEMS microphone includes: 1. thin and small size; 2. SMD (surface mountable device) indicating easy assembly with sold flow; 3. high stability and environmental resistance. However, in comparison with the IC package, the requirements of microphone package include receiving the sound pressure from acoustic signal, inducing mechanical motion and transferring to electrical signal. Therefore it needs an acoustic path to receive the sound pressure, a transducer to response the sound pressure, a sufficient back volume for transducer to reduce the damping coefficient and a good shielding to protect it from EMI. Currently, the most popular package is that the transducer is mounted on PCB and electrically couple to such PCB, and the conductive housing with an aperture is attached to the PCB enclosing the transducer.

FIG. 1 is a cross-sectional view, schematically illustrating a structure of MEMS device. In FIG. 1, the substrate 100, such as silicon substrate, has an indent space define by the sidewall 108 corresponding to a diaphragm region. The substrate 100 has multiple through holes 110 within the indent space define by the sidewall 108, which is defined by a side wall. A dielectric structural layer 102 is formed on the substrate 100. A MEMS diaphragm 106 is held by the dielectric structural layer 102 at the periphery. As a result, a chamber between the MEMS diaphragm 106 and the substrate 100 is formed, in which a gap with a distance d is formed. The chamber 112 is connected to the indent space define by the sidewall 108 by the through holes 110, so that the vibrating air induced by the MEMS diaphragm for sensing voice is possible. A capacitance formed between the MEMS diaphragm 106 and the substrate 100 is also changed. The variation of the capacitance can be converted into electric signal. Then, the MEMS device in FIG. 1 can serve as a MEMS microphone.

FIG. 2 is a schematic drawing for an electric circuit of MEMS microphone based on the MEMS device. In FIG. 2, the circuit includes a MEMS sensing capacitor Cmic, a circuit capacitor with capacitance Ccir, and an amplifier Amp, and a resistor with resistance R. The MEMS sensing capacitor with the capacitance Cmic can sense an audio signal. According to the circuit, the audio signal is converted as the voltage signal Vout as the output.

As can be seen in FIG. 2, the signal Vout is proportional to ΔCmic. If the capacitance Cmic is larger, then the output signal Vout can be amplified a large level. The sensitivity can then be improved. Since the capacitance is inversely proportional to the distance d, the capacitance can be increased by reducing the distance. However, the distance cannot be reduced without restriction. If the distance d of gap of the MEMS capacitor is too small, the structure may be not easily fabricated.

Conventionally, to improve the sensitivity of microphone, the most effective method is to decrease the air gap (d). However, the decreasing of air gap will result in the decreasing of pull-in voltage of diaphragm, indicating lower VPP is used. The decreasing of VPP will decrease the sensitivity, because the pull-in voltage is proportional to strength of electrical field (E=VPP/d). If d is decreasing, E will be increasing.

In addition, a surface current leakage should be considered. FIG. 3A is a cross-sectional view, schematically illustrating a structure of MEMS device with current leakage. In FIG. 3A, when the MEMS diaphragm is at the voltage VPP and the substrate is at the ground voltage, a current leakage may occur on the surface of the dielectric sidewall as indicated by arrow leak.

FIG. 3B is a schematic drawing for an electric circuit of MEMS microphone based on the MEMS device with current leakage. When the current leakage occurs, a parasitic resistor with leakage resistance Rleak is coupled with the capacitor Cmic in parallel. The sensitivity is degraded and the output noise may also increase.

Since the capacitance is related to sensitivity and is related to a distance between the MEMS diaphragm and the substrate. How to have high capacitance for the MEMS device without causing current leakage is still an issue to improve.

SUMMARY OF THE INVENTION

The invention provides a MEMS device, which can have improved capacitance without reducing the thickness of the MEMS capacitance.

The invention provides a MEMS device comprising a substrate, being structural having a first surface and a second surface, wherein the substrate has a plurality of through holes in the substrate within the diaphragm region. A first dielectric structural layer is then disposed over the substrate from the first surface, wherein the first dielectric structural layer has a plurality of openings corresponding to the through holes, wherein each of the through holes remains exposed by the first dielectric structural layer. A second dielectric structural layer with a chamber is disposed over the first dielectric structural layer, wherein the chamber exposes the openings of the first dielectric structural layer and the through holes of the substrate to extend to an outer space. A MEMS diaphragm is embedded in the second dielectric structural layer above the chamber, wherein an air gap is formed between the substrate and the MEMS diaphragm.

The invention provides a MEMS device comprising a substrate, having a diaphragm opening at a diaphragm region. A supporting layer is disposed on the substrate to cover the diaphragm opening, wherein the supporting layer has a plurality of through holes within the diaphragm region, so that the through holes of the supporting layer are connected with the diaphragm opening. A first dielectric structural layer is disposed over the supporting layer, wherein the first dielectric structural layer has a plurality of openings corresponding to the through holes, wherein each of the through holes remains exposed by the first dielectric structural layer. A second dielectric structural layer with a chamber is disposed over the first dielectric structural layer, wherein the chamber exposes the openings of the first dielectric structural layer. A MEMS diaphragm is embedded in the second dielectric structural layer above the chamber, wherein an air gap is formed between the supporting layer and the MEMS diaphragm.

The invention provides a method for fabricating MEMS device, comprising providing a substrate, having a first surface and a second surface. Then, a first dielectric layer is formed on the substrate at the first surface, having a first dielectric etching rate. A dielectric mask layer is formed on the first dielectric layer, having a second dielectric etching rate, wherein the second dielectric etching rate is lower than the first dielectric etching rate. A second dielectric layer is formed on the dielectric mask layer, having a third dielectric etching rate, wherein the first dielectric etching rate is lower than the third dielectric etching rate. A top dielectric structural layer is formed over the second dielectric layer, wherein a MEMS diaphragm is included in the dielectric structural layer. The substrate is patterned from the second surface to have a plurality of through holes in the substrate within the diaphragm region, wherein the through holes expose the first dielectric layer. An isotropic etching process is performed over the second surface of the substrate and the top dielectric structural layer, wherein the through holes of the substrate allows the isotropic etching process to start to etch the first dielectric layer. The isotropic etching process continuously etches dielectric materials of the first dielectric layer, the dielectric mask layer, the second dielectric layer and the top dielectric structural layer to expose the MEMS diaphragm. Due to the first dielectric etching rate, the second dielectric etching rate and the third dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention provides a method for fabricating MEMS device, comprising providing a substrate, having a first surface and a second surface. Then, a first dielectric layer is formed on the substrate at the first surface, having a first dielectric etching rate. A patterned mask layer is formed on the first dielectric layer, having a second dielectric etching rate, wherein the second dielectric etching rate is lower than the first dielectric etching rate. A second dielectric layer is formed on the patterned mask layer, having a third dielectric etching rate, wherein the first dielectric etching rate is lower than the third dielectric etching rate. A top dielectric structural layer is formed over the second dielectric layer, wherein a MEMS diaphragm is included in the dielectric structural layer. The substrate is patterned from the second surface, to have a plurality of through holes in the substrate within the diaphragm region, wherein the through holes expose the first dielectric layer. An isotropic etching process is performed over the second surface of the substrate and the top dielectric structural layer, wherein the through holes of the substrate allows the isotropic etching process to start to etch the first dielectric layer. The isotropic etching process continuously etches dielectric materials of the first dielectric layer, the second dielectric layer and the top dielectric structural layer to expose the MEMS diaphragm while the patterned mask layer serves as an etching mask. Due to the first dielectric etching rate, the second dielectric etching rate and the third dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention provides a method for fabricating MEMS device, comprising providing a substrate, having a first surface and a second surface. A first dielectric layer is formed on the substrate at the first surface, having a first dielectric etching rate. A second dielectric layer is formed on the first dielectric layer, having a second dielectric etching rate, wherein the first dielectric etching rate is lower than the second dielectric etching rate. A top dielectric structural layer is formed over the second dielectric layer, wherein a MEMS diaphragm is included in the dielectric structural layer. The substrate is patterned from the second surface, to have a plurality of through holes in the substrate within the diaphragm region, wherein the through holes expose the first dielectric layer; and. An isotropic etching process is performed over the second surface of the substrate and the top dielectric structural layer, wherein the through holes of the substrate allows the isotropic etching process to start to etch the first dielectric layer. The isotropic etching process continuously etches dielectric materials of the first dielectric layer, the second dielectric layer and the top dielectric structural layer, to expose the MEMS diaphragm. Due to the first dielectric etching rate and the second dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention provides a method for fabricating MEMS device, comprising providing a substrate, having a first surface and a second surface. A first dielectric layer is formed on the substrate at the first surface, having a first dielectric etching rate, wherein the first dielectric layer is embedded with a conductive plate having a plurality of openings within a diaphragm region. A mask layer is formed on the first dielectric layer, having a second dielectric etching rate, wherein the second dielectric etching rate is lower than the first dielectric etching rate. A second dielectric layer is formed on the dielectric mask layer, having a third dielectric etching rate, wherein the first dielectric etching rate is lower than the third dielectric etching rate. A top dielectric structural layer is formed over the second dielectric layer, wherein a MEMS diaphragm is included in the dielectric structural layer. The substrate is patterned from the second surface, to have a plurality of through holes in the substrate within the diaphragm region, wherein the through holes expose the first dielectric layer and surrounded by the conductive plate. An isotropic etching process is performed over the second surface of the substrate and the top dielectric structural layer, wherein the through holes of the substrate allows the isotropic etching process to start to etch the first dielectric layer. The isotropic etching process continuously etches dielectric materials of the first dielectric layer, the dielectric mask layer, the second dielectric layer and the top dielectric structural layer, to expose the MEMS diaphragm. Due to the first dielectric etching rate, the second dielectric etching rate and the third dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention provides a method for fabricating MEMS device, comprising providing a substrate, having a first surface and a second surface. A patterned conductive layer is formed on the substrate, wherein the patterned conductive layer has a plurality of through holes within a diaphragm region. A first dielectric layer having a first dielectric etching rate is formed on the patterned conductive layer and the substrate at the first surface, wherein the first dielectric layer is embedded with a plurality of dielectric blocks on the patterned conductive layer and surrounding the through holes of the substrate. A mask layer is formed on the first dielectric layer, having a second dielectric etching rate, wherein the second dielectric etching rate is lower than the first dielectric etching rate. A second dielectric layer is formed on the dielectric mask layer, having a third dielectric etching rate, wherein the first dielectric etching rate is lower than the third dielectric etching rate. A top dielectric structural layer is formed over the second dielectric layer, wherein a MEMS diaphragm is included in the dielectric structural layer. The substrate is patterned from the second surface, to have an opening corresponding to the diaphragm to expose the conductive layer with the through holes. An isotropic etching process is performed over the second surface of the substrate and the top dielectric structural layer, wherein the through holes of the patterned conductive layer allows the isotropic etching process to start to etch the first dielectric layer. The isotropic etching process continuously etches dielectric materials of the first dielectric layer, the mask layer, the second dielectric layer and the top dielectric structural layer, to expose the MEMS diaphragm. Due to the first dielectric etching rate, the second dielectric etching rate and the third dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention provides a method for fabricating MEMS device, comprising providing a substrate, having a first surface and a second surface. A supporting layer is formed on the substrate, wherein the supporting layer has a plurality of through holes within a diaphragm region. A patterned conductive layer is formed over the supporting layer, wherein the patterned conductive layer has a plurality of openings corresponding to the through holes. A first dielectric layer having a first dielectric etching rate is formed on the patterned conductive layer and the substrate at the first surface, wherein the first dielectric layer is embedded with a plurality of dielectric blocks, surrounding the through holes of the substrate. A mask layer is formed on the first dielectric layer, having a first dielectric etching rate, wherein the second dielectric etching rate is lower than the first dielectric etching rate. A second dielectric layer is formed on the dielectric mask layer, having a third dielectric etching rate, wherein the first dielectric etching rate is lower than the third dielectric etching rate. A top dielectric structural layer is formed over the second dielectric layer, wherein a MEMS diaphragm is included in the dielectric structural layer. The substrate is patterned from the second surface, to have an opening corresponding to the diaphragm to expose the supporting layer with the through holes. An isotropic etching process is performed over the second surface of the substrate and the top dielectric structural layer, wherein the through holes of the patterned conductive layer allows the isotropic etching process to start to etch the first dielectric layer. The isotropic etching process continuously etches dielectric materials of the first dielectric layer, the mask layer, the second dielectric layer and the top dielectric structural layer, to expose the MEMS diaphragm. Due to the first dielectric etching rate, the second dielectric etching rate and the third dielectric etching rate, the first dielectric layer is etched to form a plurality of openings corresponding to the through holes. Each of the through holes remains exposed by the first dielectric structural layer, and the second dielectric layer is etched to form a chamber, the chamber exposes the openings of the first dielectric structural layer and the through holes of the substrate to extend to an outer space.

The invention also provides a method for fabricating Micro-Electro-Mechanical System device, comprising providing a substrate, having a first surface and a second surface; forming a first dielectric structural layer on the substrate over the first surface; patterning the dielectric layer to have a plurality of openings; forming a mask layer to fully cover an exposed surface of the dielectric layer; forming a second dielectric structural layer over the substrate and the first dielectric structural layer, wherein the second dielectric structural layer is embedded with a diaphragm and an etching mask layer over the diaphragm at a periphery; patterning the substrate from the second surface to form a plurality of through holes, wherein the through holes are corresponding to the openings of the first dielectric structural layer; and performing an isotropic etching process to etching a dielectric material of the second dielectric structural layer until the diaphragm is released.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a novel MEMS device is proposed, of which capacitance of the MEMS capacitor can be improved without reducing the thickness of the MEMS capacitor.

Figure 1:
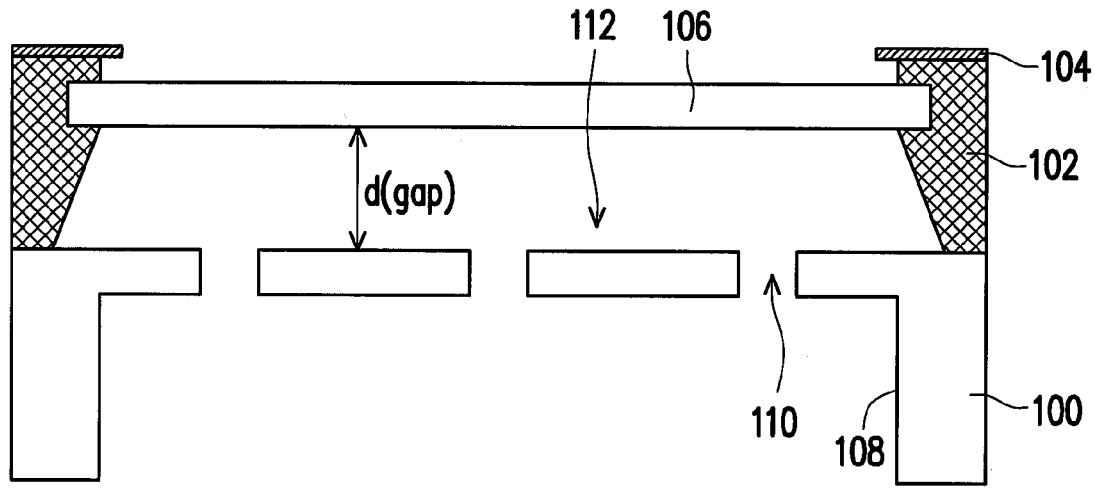
FIG. 1 is a cross-sectional view, schematically illustrating a structure of MEMS device.
Figure 2:
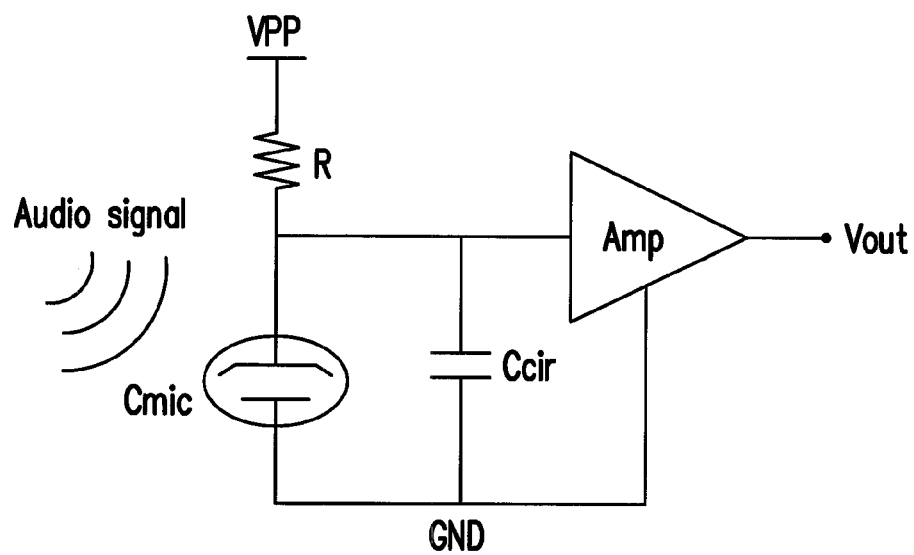
FIG. 2 is a schematic drawing for an electric circuit of MEMS microphone based on the MEMS device.
Figure 3A:
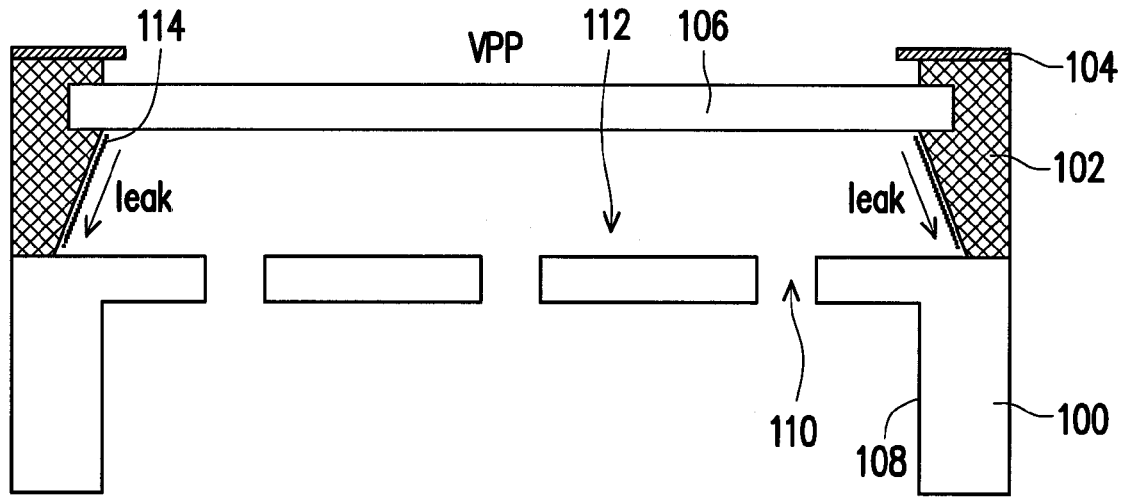
FIG. 3A is a cross-sectional view, schematically illustrating a structure of MEMS device with current leakage.
Figure 3B:
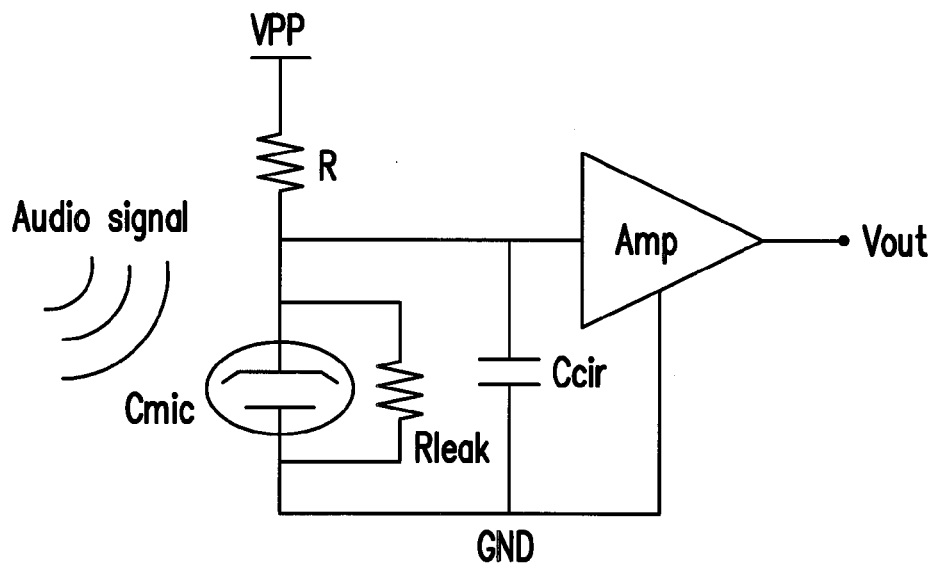
FIG. 3B is a schematic drawing for an electric circuit of MEMS microphone based on the MEMS device with current leakage.

In considering the convention structure of MEMS device as for example shown in FIG. 1, the capacitance Cmic is satisfying:

$$Cmic = \epsilon_{air} \cdot A/d \quad (1).$$

It can be found that the capacitance Cmic may also be increased by increasing the effective dielectric constant. In this consideration, the air can be replaced by some dielectric material without changing the distance d, so as to increase the capacitance. In current semiconductor fabrication, the proposed semiconductor structure can be fabricated without the adding difficult process.

Several embodiments are provided to describe the present invention. However, the present invention is not just limited to the provided embodiments. In addition, the embodiments may also be properly combined to each other.

Figure 4:
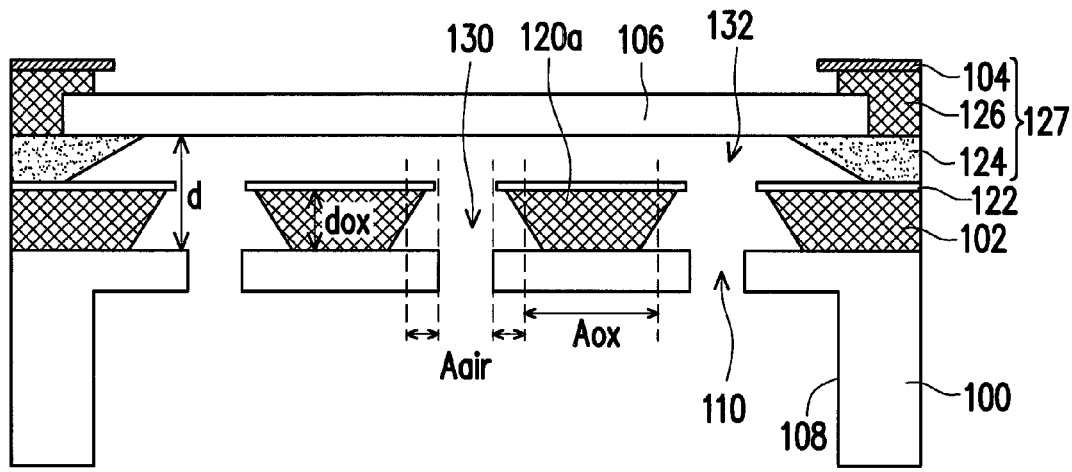
FIG. 4 is a cross-sectional structure, schematically illustrating a MEMS device, according to an embodiment of the present invention.

FIG. 4 is a cross-sectional structure, schematically illustrating a MEMS device, according to an embodiment of the present invention. In FIG. 4, a substrate 100 is provided. The substrate 100, such as silicon substrate, has a first surface and a second surface, in which an indent space defined by the sidewall 108 is formed from the second surface at a preset diaphragm region. In an example, the indent space define by the sidewall 108 can be large circular indent structure. Then, a plurality of through holes 110 in the substrate 100 within the diaphragm region is formed. The indent space define by the sidewall 108 is to reduce the thickness of the substrate 100, so that the through holes 110 are not as thick as the original substrate 100.

A first dielectric structural layer 102 is disposed over the substrate 100 from the first surface. Here, the dielectric structural layer 102 may also include several other internal structure due to fabrication process to embed some interconnect or other device. However, only the part relating to the MEMS device is shown and represented by a single dielectric layer in structure. The first dielectric structural layer 102 has a plurality of openings 130, corresponding to the through holes 110 of the substrate 100. Each of the through holes 110 remains exposed by the openings 130 of the first dielectric structural layer 102. Due to the option of fabrication process, there is a mask layer 122 disposed on the first dielectric structural layer 102. A structural layer 124 is disposed over the first dielectric structural layer 102 with an opening, which is to be formed as a chamber 132 after fully fabricated. The chamber 132 of the dielectric structural layer 124 exposes the openings 130 of the first dielectric structural layer 102 and the through holes 110 of the substrate 100. Then, the chamber 132 is connected to the indent space define by the sidewall 108 of the substrate 100. The air can flow from the chamber 132 to the indent space defined by the sidewall 108 and further to the environment by the through holes 110 and openings 130.

To have a MEMS device in structure point of view, it needs another dielectric layer 126 and a MEMS diaphragm 106 to dispose over the dielectric layer 124. Like to the first dielectric structural layer 102, the dielectric layer and the dielectric layer 124 can be treated as a second dielectric layer, so that the MEMS diaphragm 106 is embedded in the second dielectric structural layer and cover the opening of the chamber 132, which is defined between the MEMS diaphragm 106 and the first dielectric structural layer 102, on which the mask layer may or may not be on. An air gap with a distance d is then formed between the substrate and the MEMS diaphragm. It can also be known to a person with ordinary skill in the art, the MEMS diaphragm 106 can have other different structure, such as corrugated structure. However, the MEMS diaphragm 106 in this embodiment is represented by a flat layer without specific limitation. The etching mask layer 104 is also formed on the dielectric layer 126. The etching mask layer 104 is used as the etching mask during the isotropic etching process later in fabrication process, so that the dielectric portion above the MEMS diaphragm 106 can be also be etched to expose the MEMS diaphragm 106 from the top side.

Based on the structure, the capacitance between MEMS diaphragm 106 and the substrate 100 with the same distance d can be improved, because the dielectric layer 102, such as the silicon dioxide with a thickness, dox, has larger dielectric constant than the dielectric constant of the air about four times bigger. For example, the area Aox with the portion of the dielectric structural layer 102 has larger dielectric constant, such as silicon dioxide about 4. The area, indicated by Aair, is still keeping in the same original dielectric material of air for air allowing the air flow for sensing the voice. The dielectric constant of air is about 1.

In total, the effective dielectric constant for the MEMS capacitor between the substrate 100 and the MEMS diaphragm 106 can be increased. As a result, the capacitance can be improved, accordingly.

Figure 5:
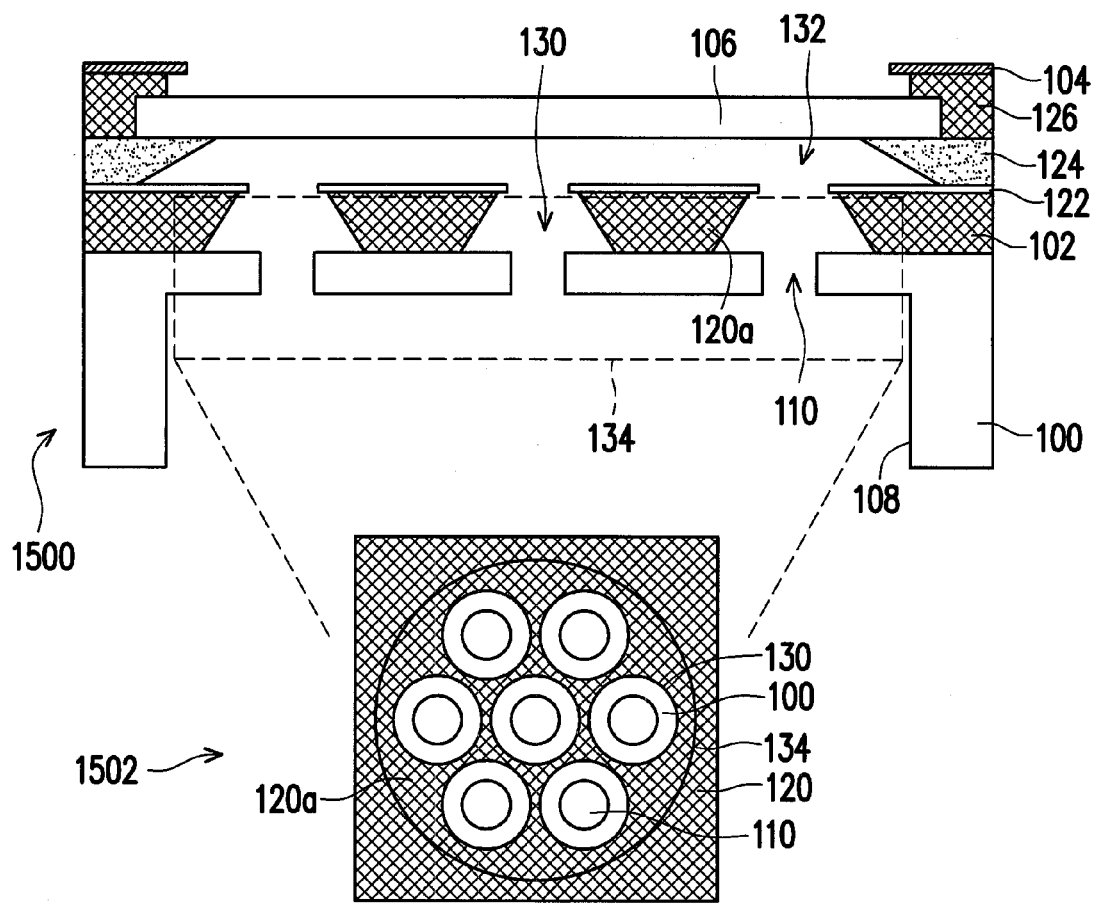
FIG. 5 is a drawing, schematically illustrating the structure of the MEMS device shown in FIG. 1 with a top view of the same structure, according to an embodiment of the present invention.

FIG. 5 is a drawing, schematically illustrating the structure of the MEMS device shown in FIG. 1 with a top view of the same structure, according to an embodiment of the present invention.

In FIG. 5, a MEMS device used in a MEMS microphone has cross-sectional view structure 1500. A top view structure 1502 of the MEMS device at the diaphragm region 134 of the MEMS device is also shown with a top view structure 1502. The diaphragm usually is formed in a circular geometric shape, which is corresponding to the indent space define by the sidewall 108. The dielectric structural layer 102 has multiple openings 130 connected to the through holes 110 of the substrate 100. The dielectric portion 120a of the dielectric structural layer 102 is referring to the portion within the diaphragm region 134. Since the diameter of the through holes 110 is usually smaller than the openings 130 of the dielectric structural layer 102, the peripheral region of the through holes 110 can still be seen in the top-view structure 1502.

It can be noted that the sidewall of the chamber 132 and the opening 130 are the slant sidewall. The slant sidewall is formed due to the proposed fabrication process in the present invention by a single isotropic process with the proper choice of different etching rate in different material layer. In other words, the structure of the dielectric portion 120a can be easily formed without other patterning process.

Figure 5A:
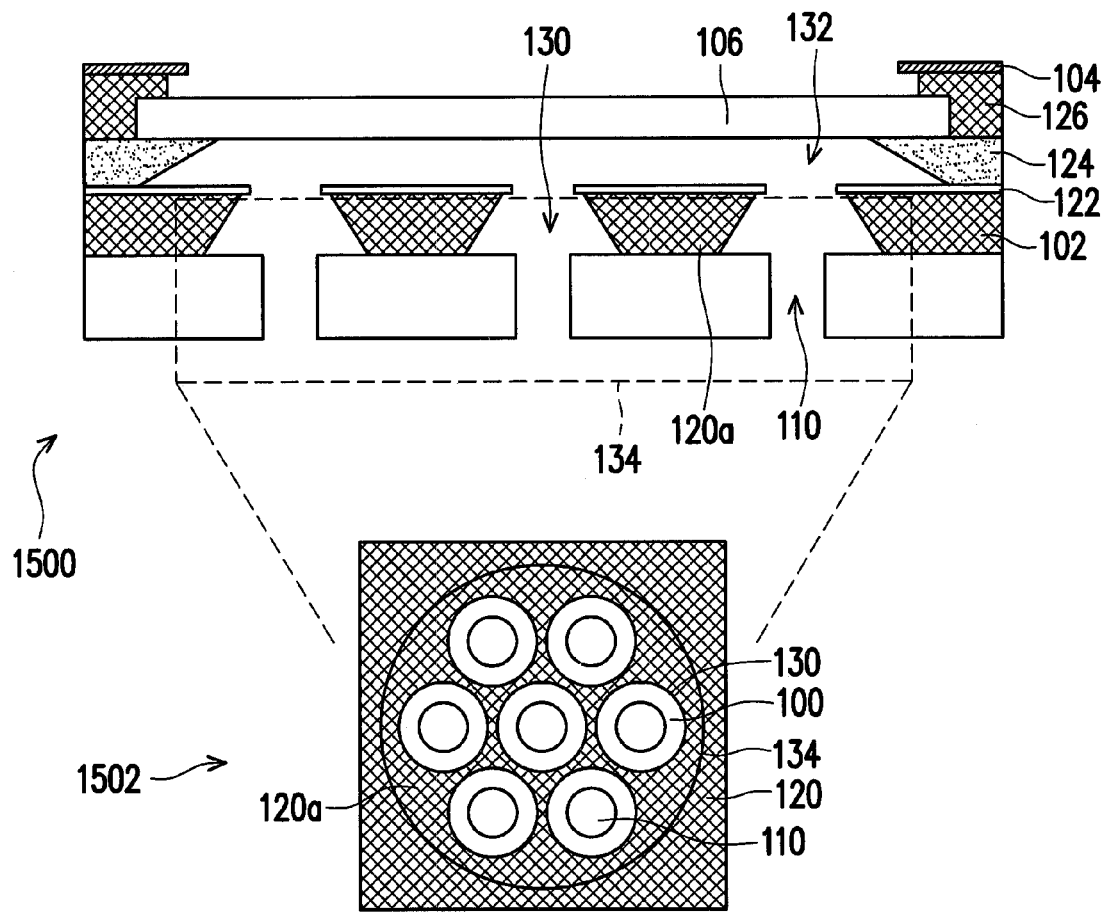
FIGS. 5A-5C drawings, schematically illustrating a structure of the MEMS device in cross-sectional view and top view, according to embodiments of the invention.
Figure 5B:
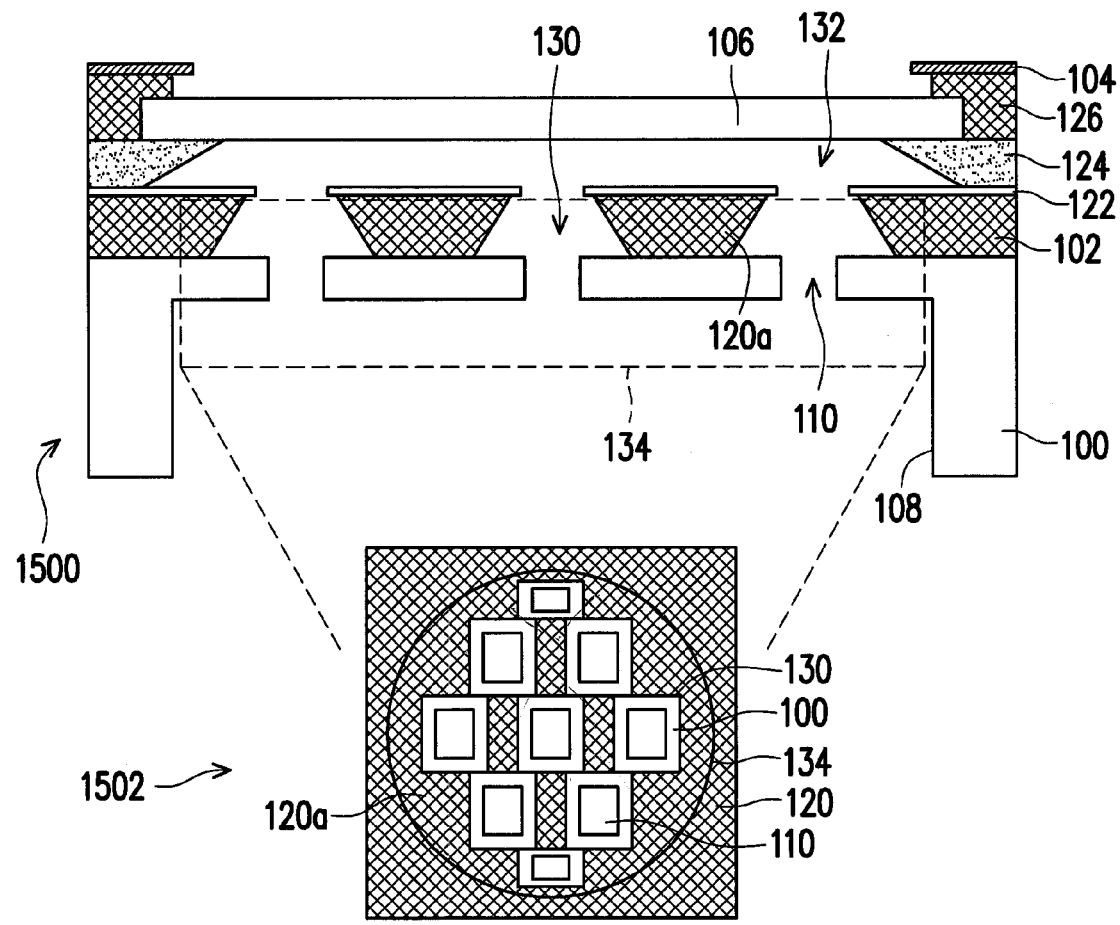
Figure 5C:
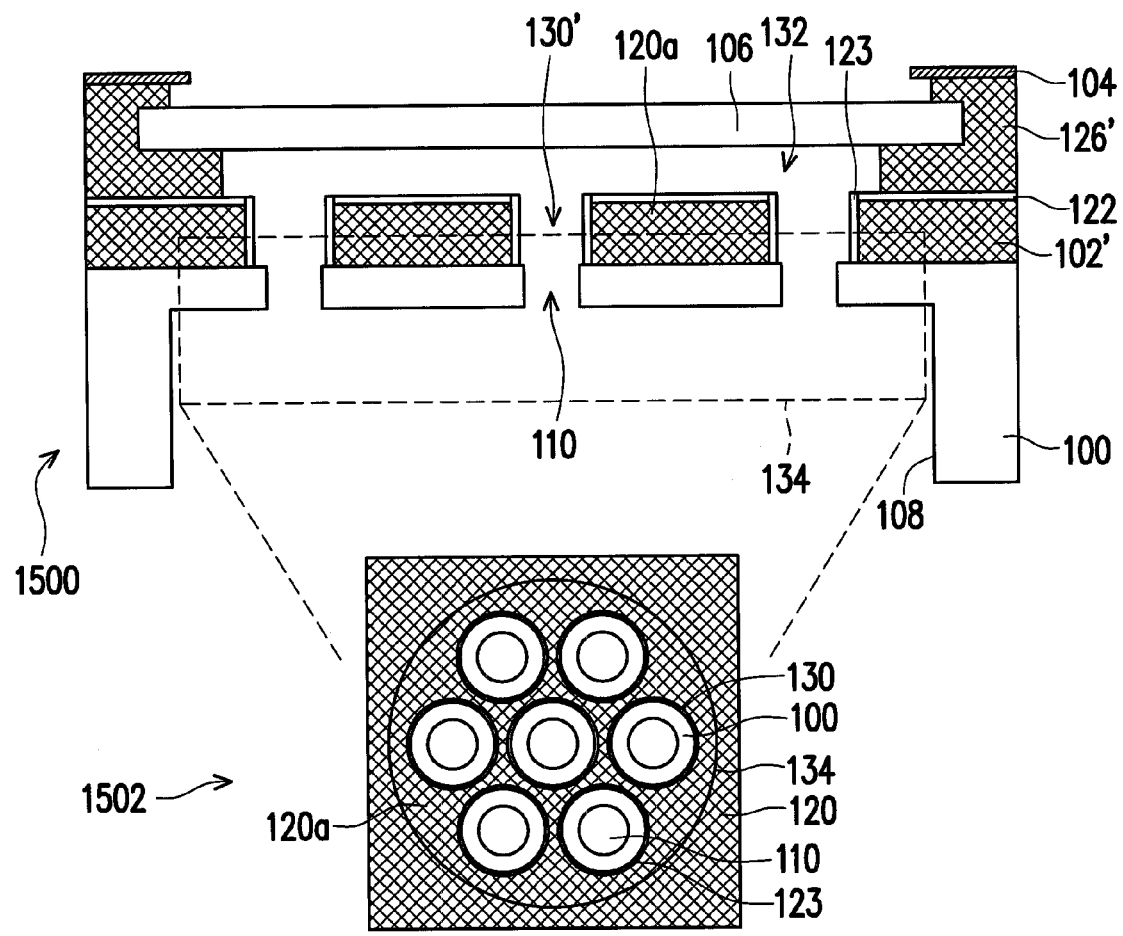

With the same consideration on increasing the capacitance, the structures can be further modified. FIGS. 5A-5C are drawings, schematically illustrating a structure of the MEMS device in cross-sectional view and top view, according to embodiments of the invention.

In FIG. 5A, the structure of MEMS device is similar to the structure of FIG. 5. The difference in th embodiment is that the substrate 100 in this embodiment is not necessary to have the indent space. The through holes 110 go through the full thickness of the substrate 100. In other words, the indent space defined by the sidewall 108 is optionally formed depending on the actual design. In the following embodiments, the indent space is shown. However, the substrate 100 can be replaced by the substrate 100 in FIG. 5A without indent space, depending on actual design.

In FIG. 5B, the structure of MEMS device is similar to the structure of FIG. 5. However, the geometric shape of the through holes 110 in the substrate 100 is not necessary to be round shape but any proper shape. In an example, the through holes 110 can also be square or rectangular. In other words, the geometric shape of the through holes is not limited to the specific geometries illustrated in embodiments. Any other proper geometric structure can be adapted in the invention. It can also be noted that the geometric shape of the opening 130 is also accordingly modified based on geometry shape of the through holes 110. In more modifications, the geometry shapes of the through holes 110 and the opening 130 can also be different. The through holes 110 is exposed openings 130. The openings 130 may be separated or connected. In this embodiment, the adjacent openings 130 are connected.

In FIG. 5C, the structure of MEMS device is based on the structure of FIG. 5. However, it may be modified in different way. The dielectric structural layer 102' with the openings 130' is disposed on the substrate 100, which has the indent space in this example. The mask layer 122 disposed between the dielectric structural layer 102' and the dielectric structural layer 126'. The sidewall of the opening 130' is also formed with the mask spacer 123. In structure, the mask spacer is formed together with the mask layer 122 and can be treated as a part of the mask layer 122 between the two dielectric structural layer 102' and 126'. The dielectric structural layer 126's also carries the diaphragm 106. In this structure, the openings 130' in the dielectric structural layer 102' can be formed by different fabricating process, and the sidewall of the through holes is basically not slant due to the different fabricating process as to be described later. However, the effect to increase the capacitance for the MEMS device is the same. In other words, the openings can be fabricated in any proper fabricating process, and may be resulting in different structure.

Figure 6:
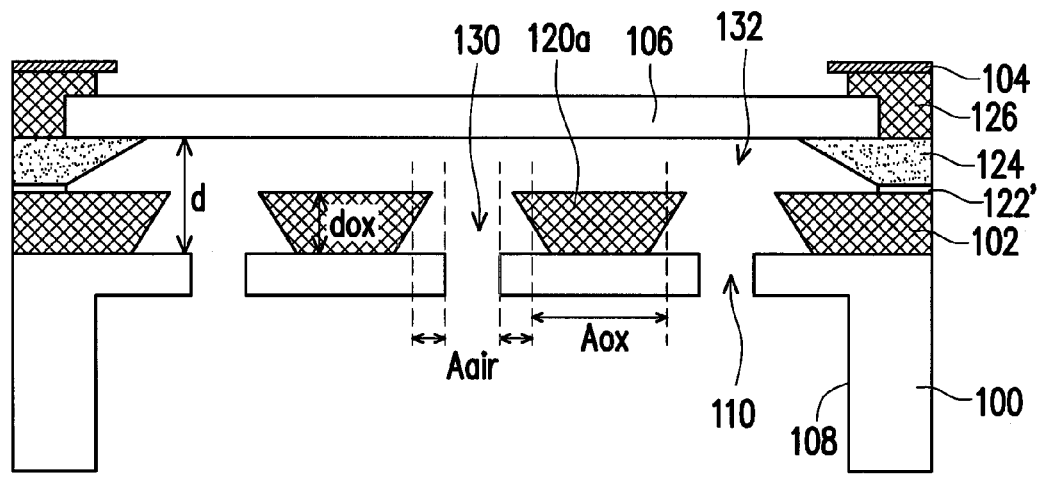
FIG. 6 is a cross-sectional structure, schematically illustrating a MEMS device, according to an embodiment of the present invention.

Alternative structures of the MEMS device are still further described. FIG. 6 is a cross-sectional structure, schematically illustrating a MEMS device, according to an embodiment of the present invention. In FIG. 6, like the structure in FIG. 4, a substrate 100 is provided. The substrate 100, such as silicon substrate, has a first surface and a second surface, in which an indent space defined by the sidewall 108 is formed from the second surface at a preset diaphragm region. In an example, the indent space define by the sidewall 108 can be large circular indent structure. Then, a plurality of through holes 110 in the substrate 100 within the diaphragm region is formed. The indent space define by the sidewall 108 is to reduce the thickness of the substrate 100, so that the through holes 110 are not as thick as the original substrate 100.

A first dielectric structural layer 102 is disposed over the substrate 100 from the first surface. Here, the dielectric structural layer 102 may also include several other internal structure due to fabrication process to embed some interconnect or other device. However, only the part relating to the MEMS device is shown and represented by a single dielectric layer in structure. The first dielectric structural layer 102 has a plurality of openings 130, corresponding to the through holes 110 of the substrate 100. Each of the through holes 110 remains exposed by the openings 130 of the first dielectric structural layer 102. Due to the option of fabrication process, there is a mask layer 122' disposed on the first dielectric structural layer 102 at the periphery of the diaphragm region. Actually, the mask layer 122' in FIG. 6 and the mask layer 122 in FIG. 4 are similar. However, since the isotropic etching process in option is taken for longer time, the inner portion of the mask layer 122 within the diaphragm is further etched away. It then becomes the structure of mask layer 122'.

Likewise, a structural layer 124 is disposed over the first dielectric structural layer 102 with an opening, which is to be formed as a chamber 132 after fully fabricated. The chamber 132 of the dielectric structural layer 124 exposes the openings 130 of the first dielectric structural layer 102 and the through holes 110 of the substrate 100. Then, the chamber 132 is connected to the indent space define by the sidewall 108 of the substrate 100. The air can flow from the chamber 132 to the indent space define by the sidewall 108 and further to the environment by the through holes 110 and openings 130.

Figure 7:
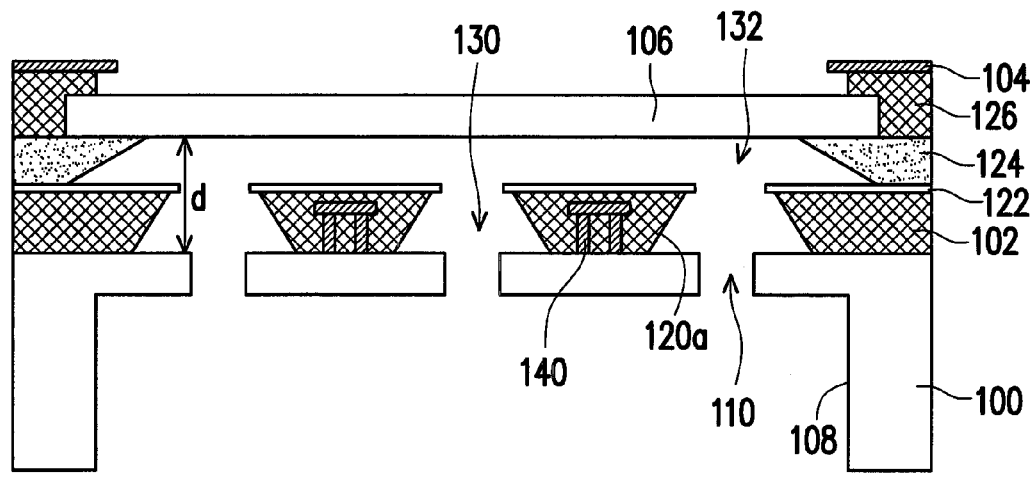
FIG. 7 is a cross-sectional structure, schematically illustrating a MEMS device, according to an embodiment of the present invention.

A further embodiment with another structure is provided. FIG. 7 is a cross-sectional structure, schematically illustrating a MEMS device, according to an embodiment of the present invention. In FIG. 7, the main MEMS structure is still based on the MEMS structure in FIG. 4. However, the dielectric portion 120a of the dielectric structural layer 102 within the diaphragm region or the indent space define by the sidewall 108 can be embedded with a plurality of dielectric blocks 140, surrounding the through holes 110. The dielectric blocks 140, for examples, are formed by a dielectric material, surrounded by the conductive walls. The conductive walls, for example, include the vertical wall and the horizontal wall on the vertical wall. In an example, each or some of the through holes 110 can be enclosed by the dielectric block 140. The dielectric blocks 140 can contact on the substrate 100 with the vertical walls and the horizontal cap layer is on the vertical walls at top. As known to the person with ordinary skill in the art, in order to form the vertical wall and the horizontal cap layer, it needs several sub-dielectric layers for patterning and depositing the conductive materials in the sub-dielectric layers. However, all of the needed dielectric layers is represented and shown by the dielectric structural layer 102. The dielectric blocks 140 contacting the substrate 100 can extend up and to be closer to the MEMS diaphragm 106. As a result, the effective gap distance of the capacitor can be reduced and the capacitance can be improved. The dielectric block 140 may just be within the diaphragm region without being in the peripheral region of the dielectric structural layer 102. However, there is no limitation. The dielectric block 140 can extend to the peripheral region. In addition, the cross-sectional structure of the dielectric block 140 is also not limited to the embodiment.

It can also be noted in this embodiment of FIG. 7, the mask layer 122 remains on the dielectric portion 120a. However, the mask layer 122 on the dielectric portion 120a may also be etched away, like the structure in FIG. 6, without restriction. The other structure parts of the MEMS device with the same numeral reference are the same and not to be further described.

Figure 8:
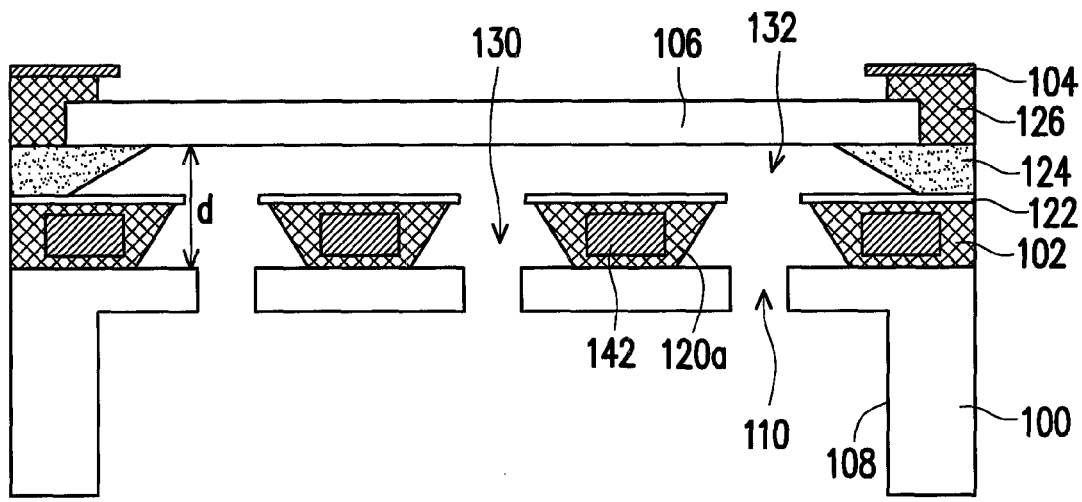
FIG. 8 is a cross-sectional structure, schematically illustrating a MEMS device, according to an embodiment of the present invention.

Another MEMS structure as an embodiment is still shown. FIG. 8 is a cross-sectional structure, schematically illustrating a MEMS device, according to an embodiment of the present invention. In FIG. 8, the main structure of the MEMS device is also based on the structure in FIG. 4 and FIG. 7. However, the dielectric structural layer 102 may also include a conductive plate 142, embedded in the dielectric structural layer 102 at the diaphragm region and the peripheral region. The conductive plate 142 can also cause the increase of capacitance. The conductive plate 142 is not necessary to contact on the substrate 100. However, the conductive plate 142 may contact on the substrate 100 in fabrication option. The effect to improve capacitance may have difference. It can also ne noted that the conductive plate 142 generally can be also referred as a back plate 142 in structure to surround the through holes 110 of the substrate 100. The back plate 142 is not limited to the conductive plate.

Figure 9:
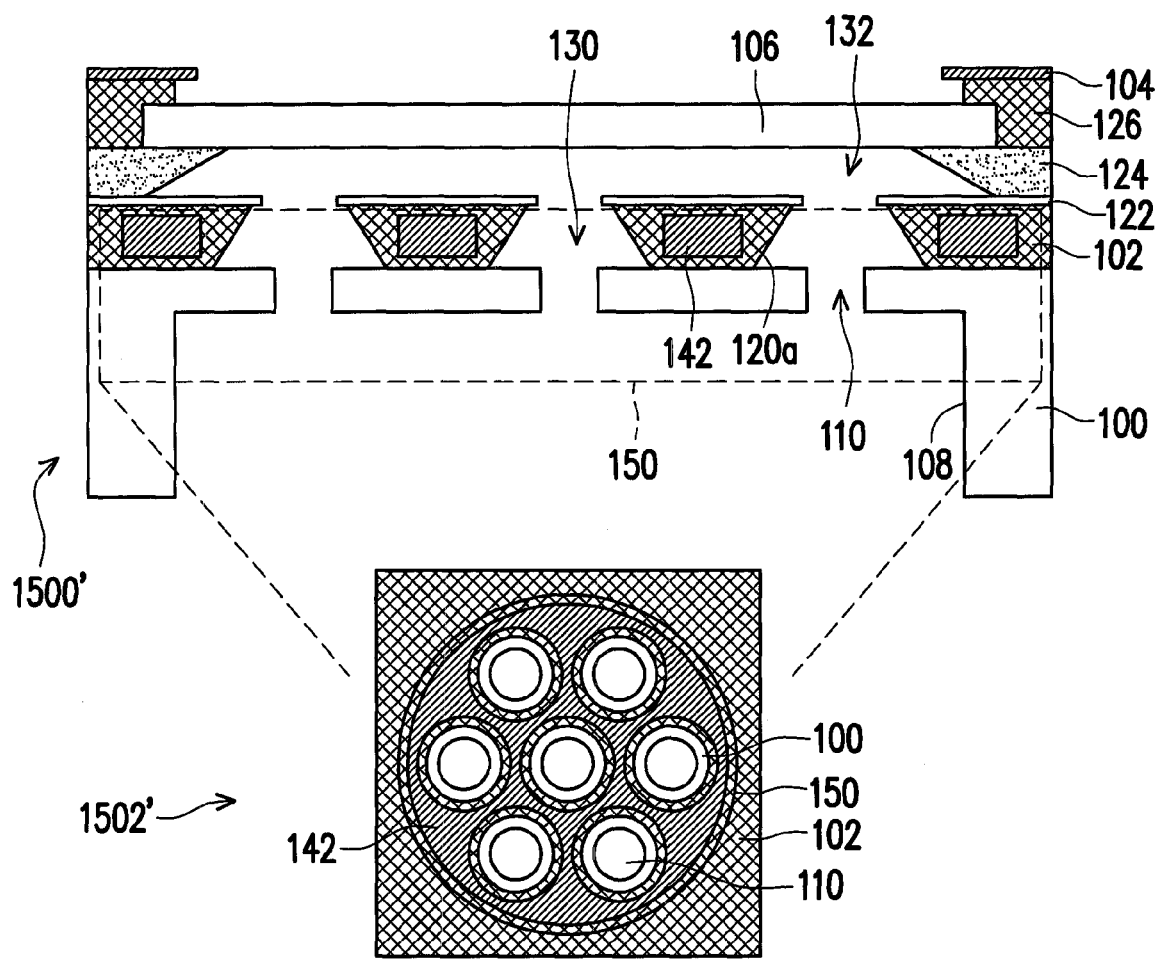
FIG. 9 is a drawing, schematically illustrating the structure of the MEMS device shown in FIG. 8 with a top view of the same structure, according to an embodiment of the present invention.

To be easier to understand the MEMS structure, a top view structure is further shown. FIG. 9 is a drawing, schematically illustrating the structure of the MEMS device shown in FIG. 8 with a top view of the same structure, according to an embodiment of the present invention.

In FIG. 9, the cross-sectional structure 1500' of the MEMS devise is shown. The top view structure 1502' with the diaphragm region 150 in the cross-sectional structure 1500' is also shown. The conductive plate 142 also has a plurality of openings corresponding to the through holes 110 of the substrate 100. In other words, generally, the conductive plate 142 surrounds the through holes 110 of the substrate 100.

Figure 10:
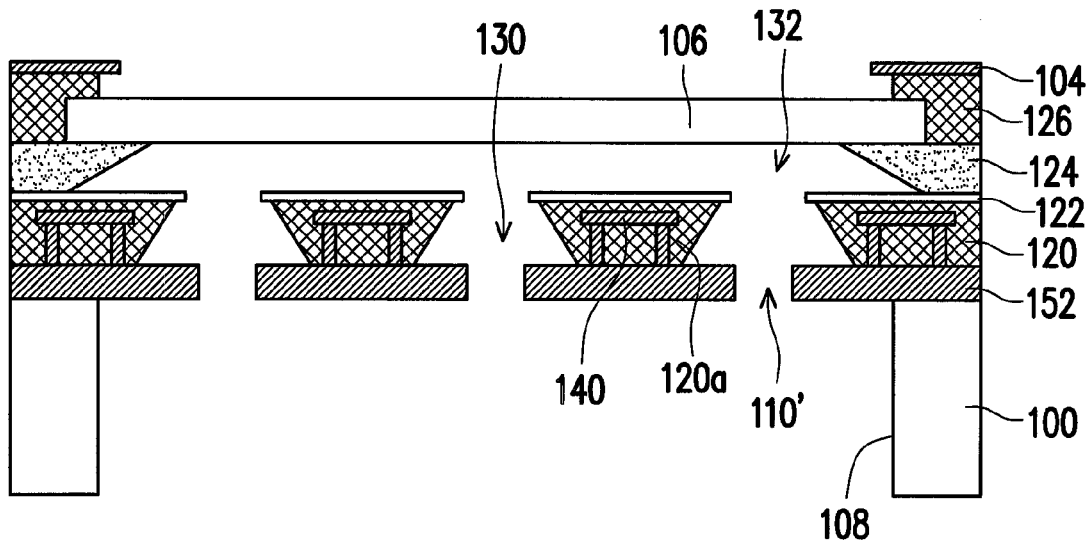
FIG. 10 is a cross-sectional structure, schematically illustrating a MEMS device, according to an embodiment of the present invention.

A further embodiment with alternative MEMS structure is still provided. FIG. 10 is a cross-sectional structure, schematically illustrating a MEMS device, according to an embodiment of the present invention.

In FIG. 10, based on the structure as shown in FIG. 4 and FIG. 7, they can be combined into another embodiment for the structure for the dielectric structural layer. In addition, the substrate 100 can be modified. In this embodiment, the substrate 100 is patterned to have an opening through the substrate defined by the sidewall 108. In this embodiment, the indent space in FIG. 4 is extending through the substrate 100. Then, a conductive plate layer 152 is disposed on the substrate over the opening. The conductive plate layer 152 has a plurality of through holed 110'. The conductive plate layer 152 and the substrate 100 form the similar structure of the substrate 100 with the through holes 110 in FIG. 4.

In addition to this embodiment, the dielectric blocks 140 are also formed in the dielectric portion 120a of the dielectric structural layer 120. However, the dielectric blocks 140 can also be in any proper region of the dielectric structural layer 120. The dielectric blocks 140 contact the conductive plate layer 152. Also and, the conductive plate layer 152 contacts on the substrate. As a result, the gap distance for the MEMS capacitor can be reduced and then the capacitance can be improved because the horizontal cap layer on the dielectric blocks 140 is closer to the MEMS diaphragm 106 than the substrate 100 or the conductive plate layer 152. The capacitance is then improved.

Figure 11:
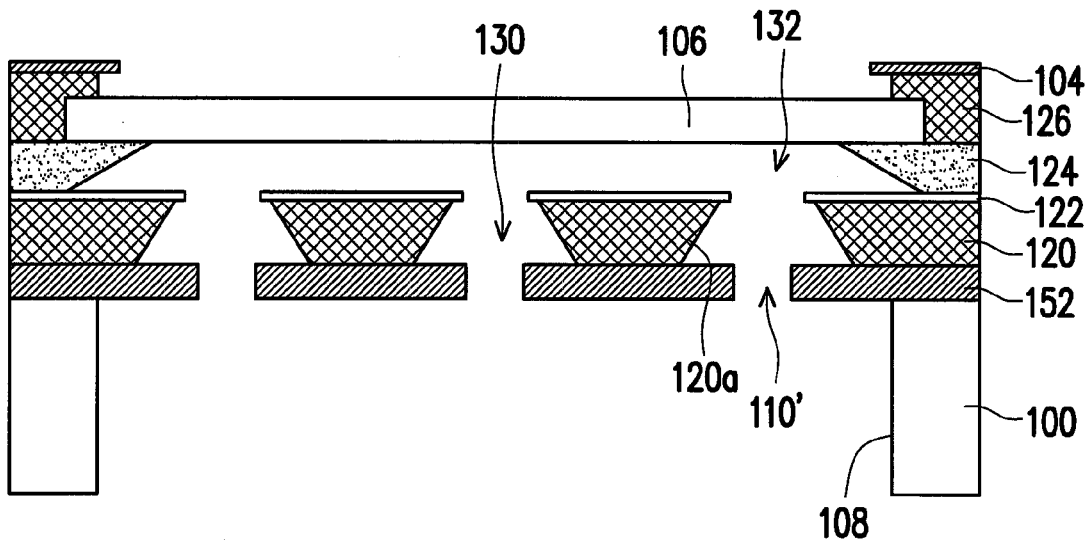
FIG. 11 is a cross-sectional structure, schematically illustrating a MEMS device, according to an embodiment of the present invention.

A further alternative structure of the MEMS device is shown in another embodiment. FIG. 11 is a cross-sectional structure, schematically illustrating a MEMS device, according to an embodiment of the present invention.

In FIG. 11, as previously mention, the dielectric blocks are the additional choice. Based on the structure in FIG. 10, the dielectric blocks 140 are omitted. Due to the dielectric portion 120a of the dielectric structural layer 120, the dielectric constant can be increased, and the capacitance is then accordingly increased.

Figure 12:
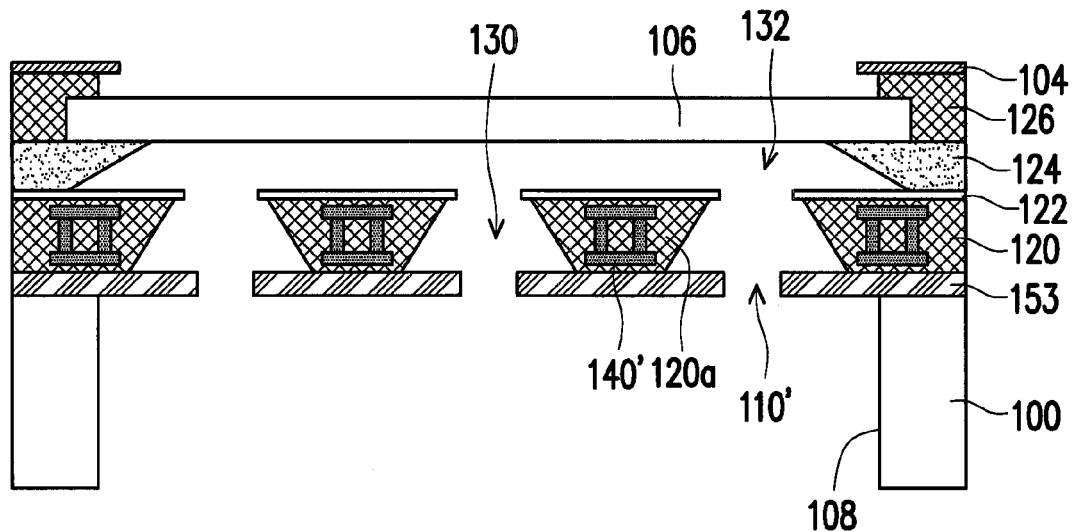
FIG. 12 is a cross-sectional structure, schematically illustrating a MEMS device, according to an embodiment of the present invention.

A further alternative structure of the MEMS device is shown in another embodiment. FIG. 12 is a cross-sectional structure, schematically illustrating a MEMS device, according to an embodiment of the present invention.

In FIG. 12, the conductive plate as shown in FIG. 11 can also be modified to be a supporting layer 153. The supporting layer 153 can be conductive or non-conductive rigid plate, to provide the supporting effect. The supporting layer 153 also has a plurality of through holes 110'. The dielectric structural layer 120 is also embedded with the dielectric blocks 140'. In this embodiment, the dielectric blocks 140' embedded in the dielectric portion 120' are formed by two vertical walls and two horizontal walls to wrap the dielectric material inside.

Figure 13:
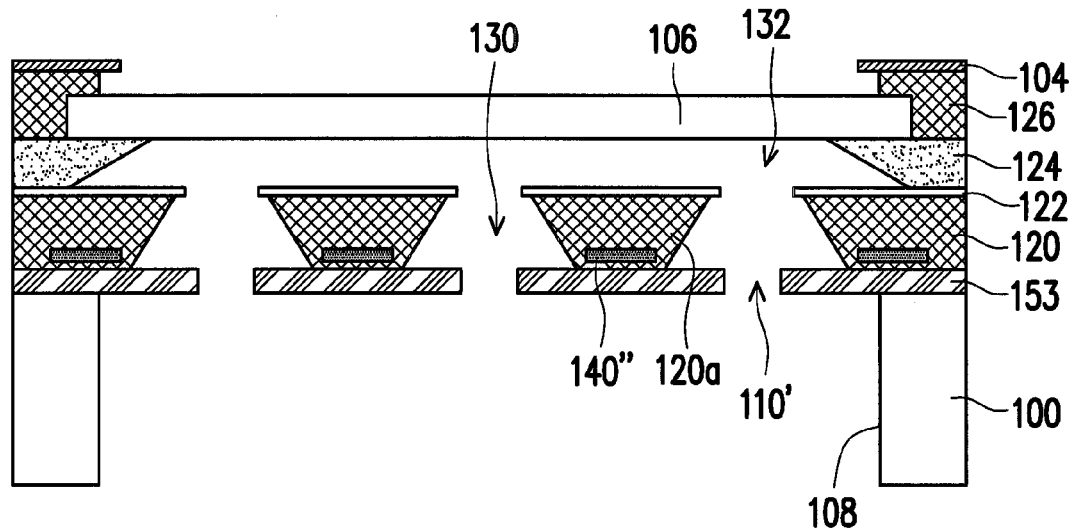
FIG. 13 is a cross-sectional structure, schematically illustrating a MEMS device, according to an embodiment of the present invention.

FIG. 13 is a cross-sectional structure, schematically illustrating a MEMS device, according to an embodiment of the present invention. In FIG. 13, another structure of the MEMS device is further shown. Comparing the structure of this embodiment in FIG. 13 with the structure in FIG. 12, the dielectric blocks 140' in previous embodiment of FIG. 12 can be modified as a single conductive layer 140".

In other words, the provided embodiments can be combined into other embodiments without being limited to the provided specific embodiments.

In the following embodiments, the semiconductor fabrication processes are described. Due to different structures of the MEMS device, fabrication processes can be modified in each embodiment. However, the general concept still remains the same.

FIGS. 14A-14H are the cross-sectional views, schematically illustrating a fabrication process flow, according to an embodiment of the invention. To have the MEMS structure shown in FIG. 4 as an example, the process flow starts from FIG. 14A. A substrate 200 is provided. The substrate 100 can be silicon substrate in an example. Usually, the thickness of the substrate is thick when comparing the size for the MEMS device.

A dielectric layer 202, such as silicon oxide, is formed on the substrate 100 at the top surface, also referred as the first surface. The dielectric layer 202 may have other internal structure as described in previous structures of embodiment and can be known by person with ordinary skill in the art. However, the dielectric layer 202 is shown in single layer, as an example. A mask layer 204 is formed on the dielectric layer 202. The material of the mask layer 204 can be predetermined to be the hard dielectric material with low etching rate when the isotropic etching process is performed later.

Another dielectric layer 206 is formed on the mask layer 204. The material of the dielectric layer 206 can be set to have a higher etching rate than the mask layer 204 and further than the dielectric layer 202, for example. The effect of the etching rate can be seen later when the isotropic etching process is performed later.

Then, a MEMS diaphragm 208 can be formed on the dielectric layer 206. In order to form the MEMS diaphragm 208, it usually needs the dielectric layer 210 with proper patterning process in fabrication. This internal dielectric structure can be known by the one with ordinary skill in the art. The MEMS diaphragm 208 can also be in other form, such as the corrugate diaphragm known in the art. In other words, the MEMS diaphragm 208 is represented by a flat single layer, generally. In addition, in order to expose the MEMS diaphragm 208 at the final product under the isotropic etching process, an etching mask layer 212 can be embedded in the dielectric layer 210.

Figure 14A:
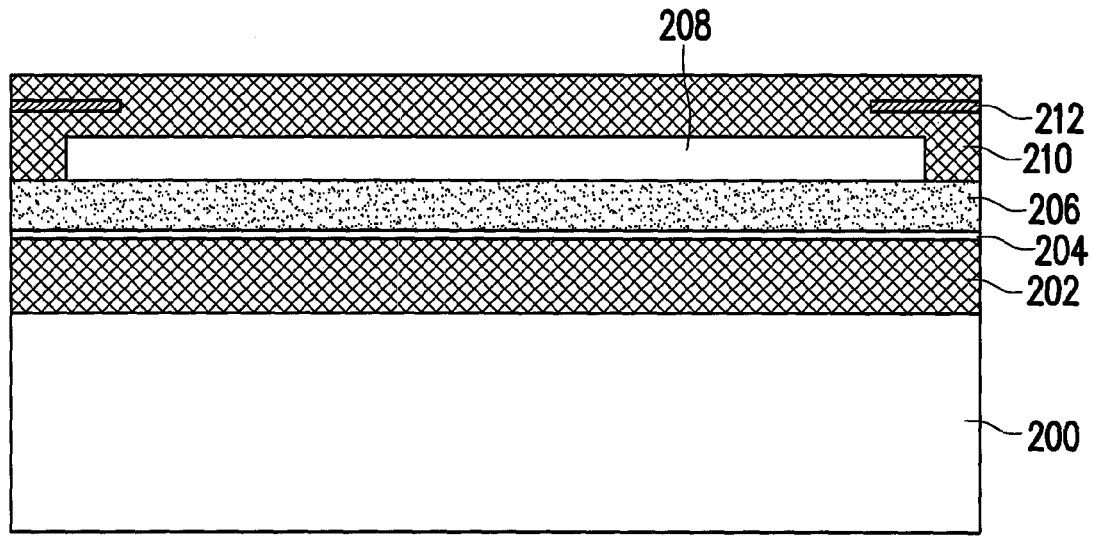
FIGS. 14A-14H are the cross-sectional views, schematically illustrating a fabrication process flow, according to an embodiment of the invention.
Figure 14B:
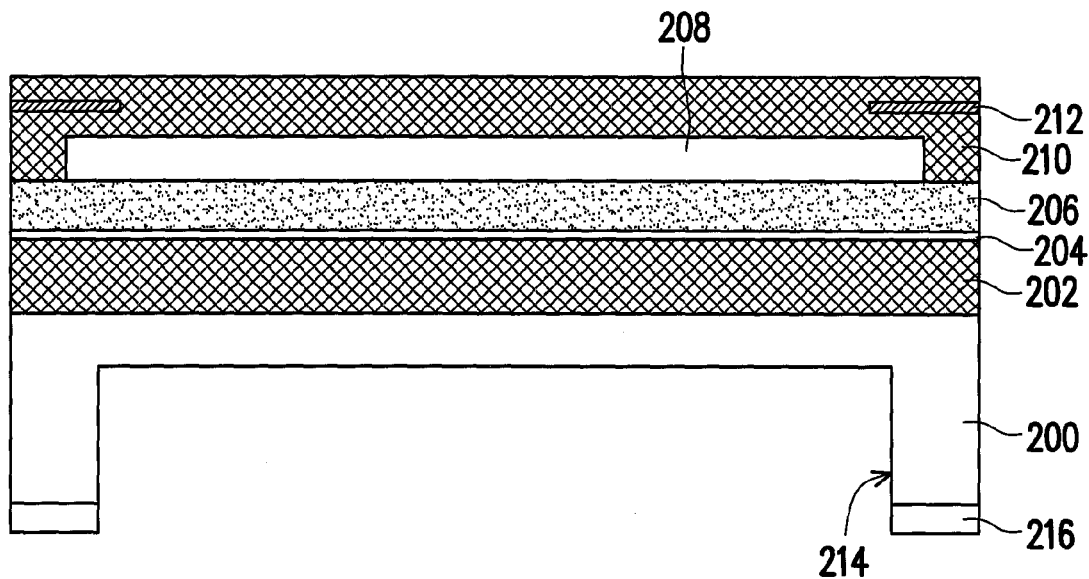

In FIG. 14B, the substrate 200 can be patterned to have an indent space at the diaphragm region. A photoresist layer 216, serving as an etching mask, is formed on the substrate at a back surface, or referred as the second surface. The photoresist layer 216 with the opening pattern corresponding to the predetermined diaphragm region is formed by photolithography process. Then, an anisotropic etching process can be performed form the second surface of the substrate 200 to etch the substrate 200 by a depth and then the indent space is formed and defined by the sidewall 214 of the substrate 200. The thickness of the substrate 200 within the indent space is significantly reduced.

Figure 14C:
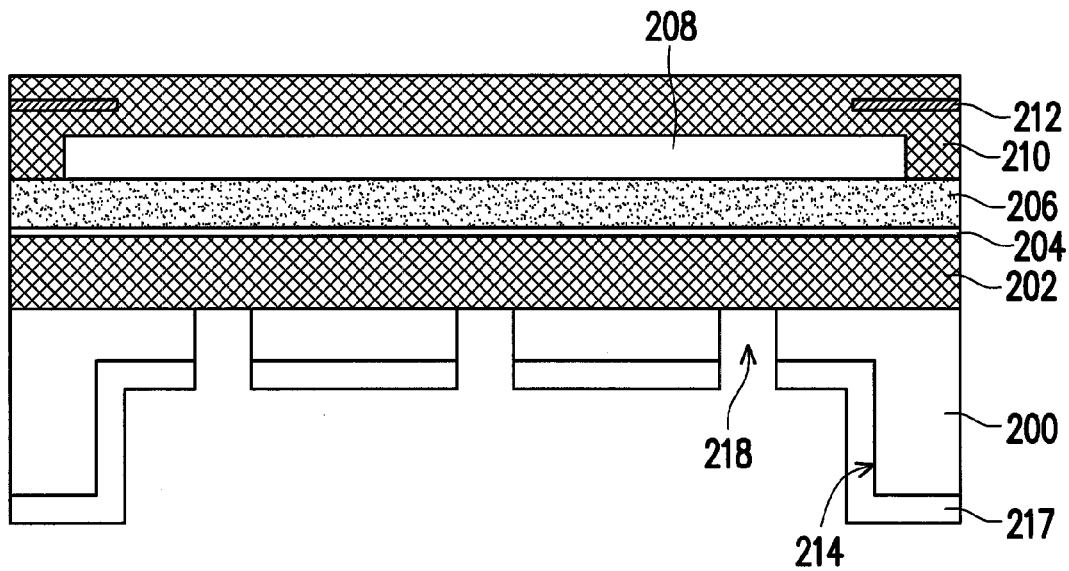
Figure 14D:
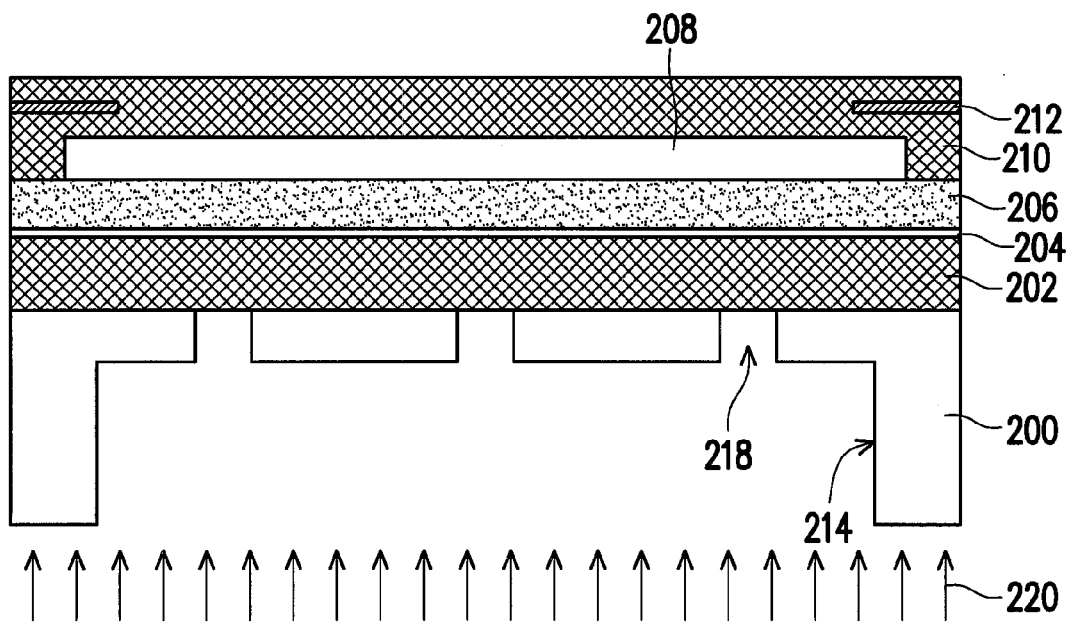

In FIG. 14C, another etching mask layer 217, such as photoresist layer, can be further formed one the substrate 200 at the second surface. The etching mask layer 217 has a pattern with a plurality of opening to expose the substrate 200 within the indent space. Another anisotropic etching process is performed to etch the substrate, using the etching mask layer 217 as the etching mask. The exposed portion of the substrate is etched until the dielectric layer 202 is exposed. A plurality of the through holes 218 are form in the substrate 200 within the indent space. The etching mask layer 217 is then removed. In FIG. 14D, after the etching mask layer 217 is removed by a stripping process 220. The substrate 200 is at the second surface is then exposed. In which the dielectric layer 202 is still exposed by the through holes 218.

Figure 14E:
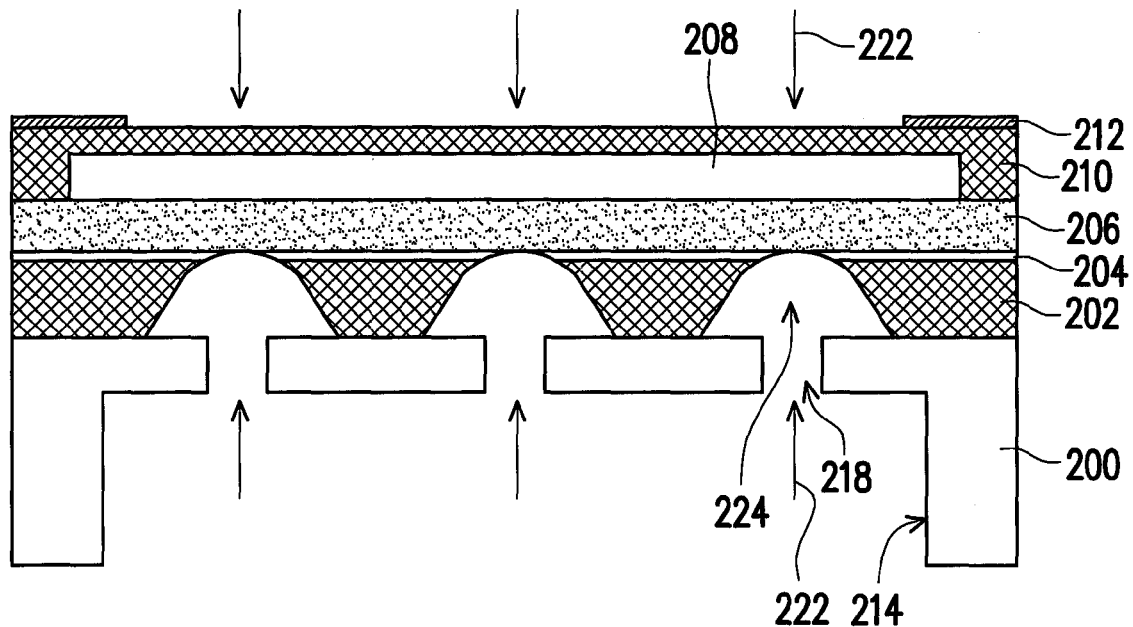

In FIG. 14E, an isotropic etching process 222 is performed from both sides of the substrate 200 to etch the exposed portion of dielectric materials in various layers. The isotropic etching process 222 from the second surface of the substrate 200 etches the dielectric layer 202 via the through holes 218, so that the dielectric layer 202 is etched starting from the exposed portion within the through holes 218. At the same time the dielectric layer 210 at the top is also etched to expose the etching mask layer 212, so that preliminary openings 224 are formed. The isotropic etching process 222 also etches a portion of the mask layer 204 is also etched to expose the dielectric layer 206.

Figure 14F:
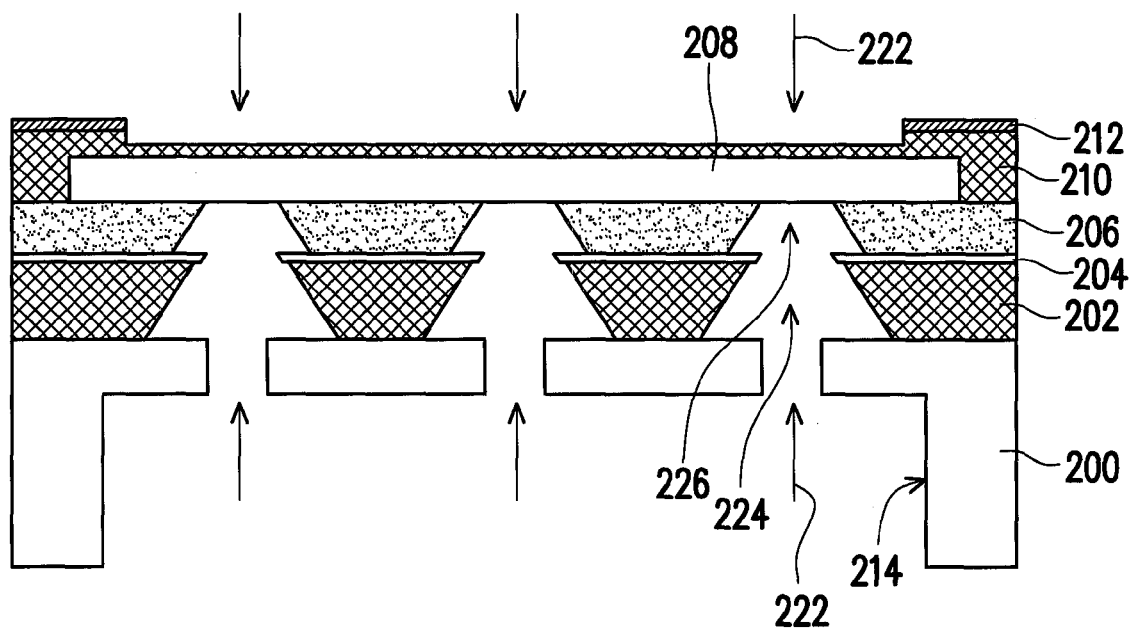

In FIG. 14F, the isotropic etching process 222 is continuously performed. At the top side, the exposed portion of the dielectric layer 210 is etched while a portion of the dielectric layer masked by the etching mask layer 212 still remains. At the bottom side, since a portion of the dielectric layer 206 has been exposed, the dielectric layer 206 with higher etching rate can be etched faster. As a result, a plurality of openings 224 is then completely formed in the dielectric layer 202. The opening 224 has the slant sidewall with a larger aperture to expose the through holes 218 of the substrate 200. However, due to the mask layer 2024 with lower etching rate, the remaining portion of the mask layer 204 can mask the dielectric layer 202. The isotropic etching process then etches the dielectric layer 206 to expose a portion of the MEMS diaphragm 208. The space to be formed as a chamber 226 is preliminarily formed.

Figure 14G:
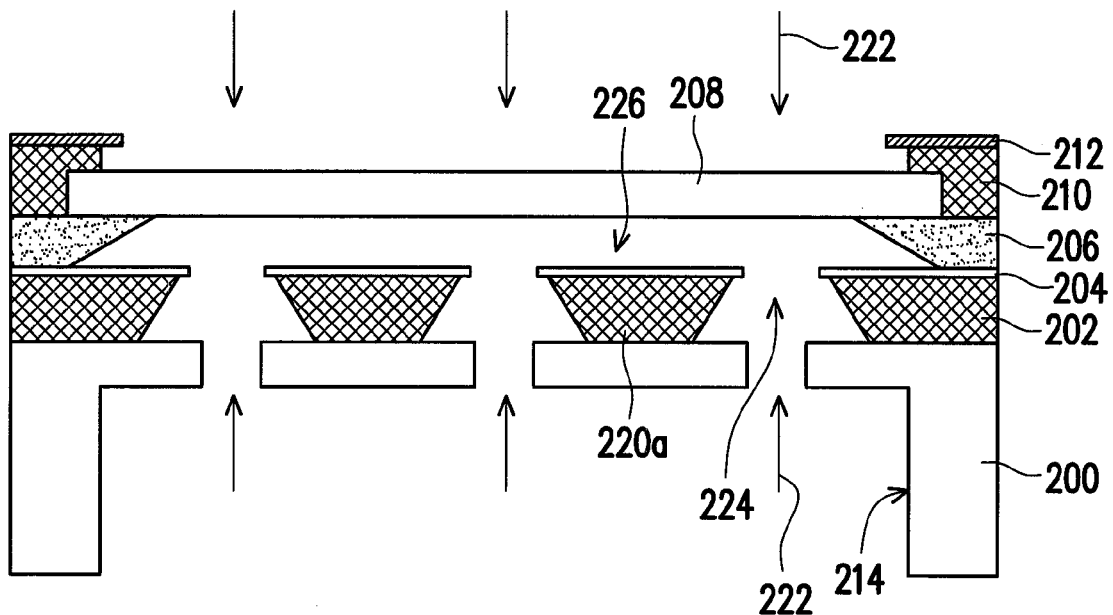

In FIG. 14G, the isotropic etching process 222 is continuously performed. Due to the effect of the mask layer 206, the chamber 226 is formed by etching the dielectric layer 206 to expose the MEMS diaphragm 208 and the dielectric portion 220a under the mask layer 204 still remains. At the top side, the dielectric layer 210 is etched to expose the MEMS diaphragm 208. At this stage, the MEMS device has been formed.

Figure 14H:
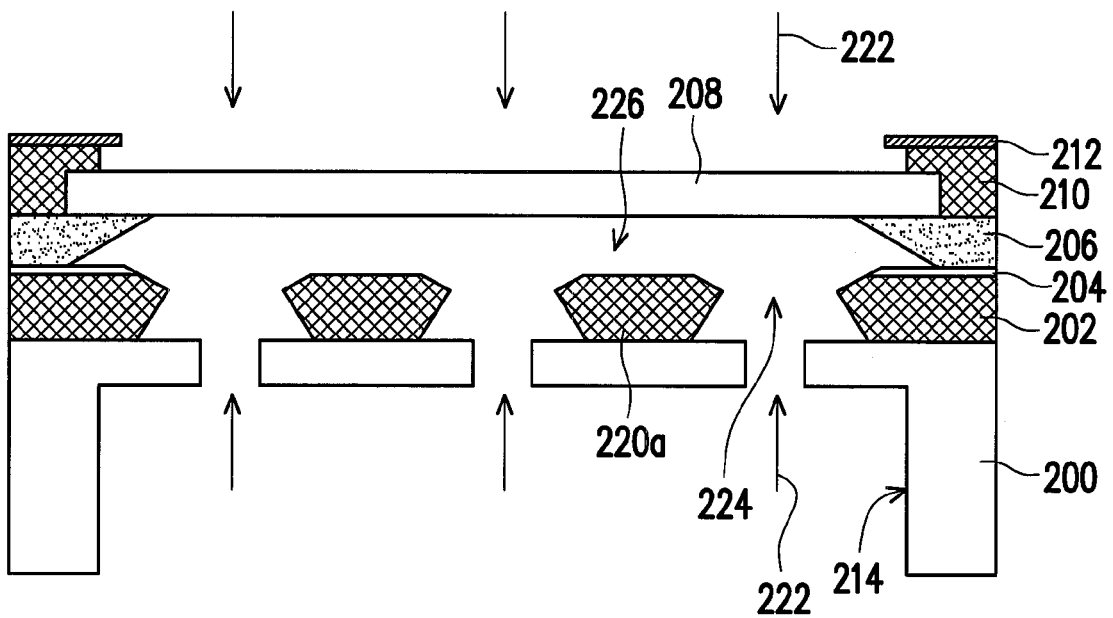

In FIG. 14H, if the mask layer 2024 on the dielectric portion 220a is intended to be removed, the isotropic etching process can be further continued to etch a portion of the mask layer 204 away. However, this process is an option, according to the intended structure.

Alternatively, in order to increase capacitance without changing the gap distance d, another fabrication process is provided. FIGS. 15A-15F are cross-sectional views, schematically illustrating another process flow to fabricate MEMS device, according to an embodiment of the invention.

Figure 15A:
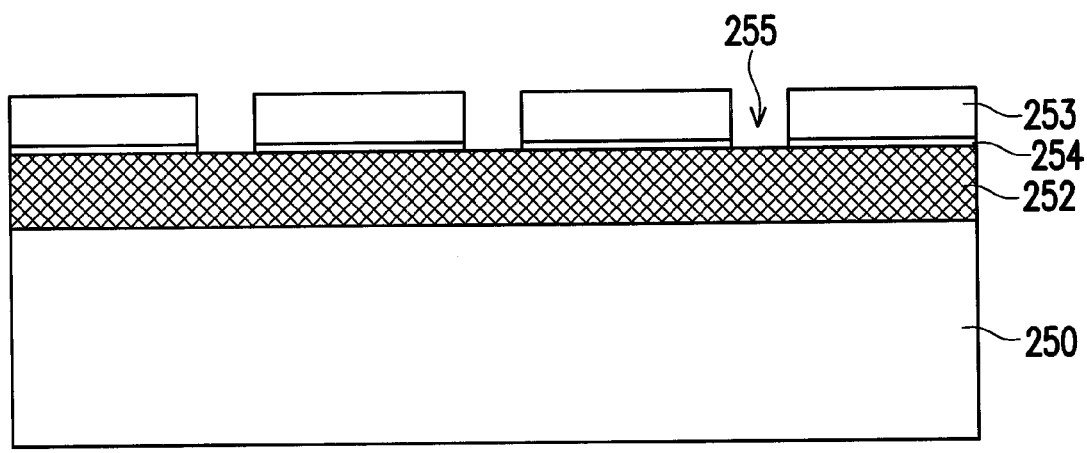
FIGS. 15A-15F are cross-sectional views, schematically illustrating another process flow to fabricate MEMS device, according to an embodiment of the invention.

In FIG. 15A, a substrate 250, such as silicon substrate, is provided. A dielectric layer 252 is formed over the substrate 250. A patterned hard mask layer 254 with a plurality of openings 255 is formed on the dielectric layer 252. The patterned hard mask layer 254 can be formed by, for example, preliminarily depositing a hard mask layer, which can be conductive layer or dielectric layer. After then, a photoresist layer 253 with a pattern of openings is formed on the hard mask layer. Then, the hard mask layer is etched, using the photoresist layer 253 as the etching mask layer, to have a plurality of openings 255.

Figure 15B:
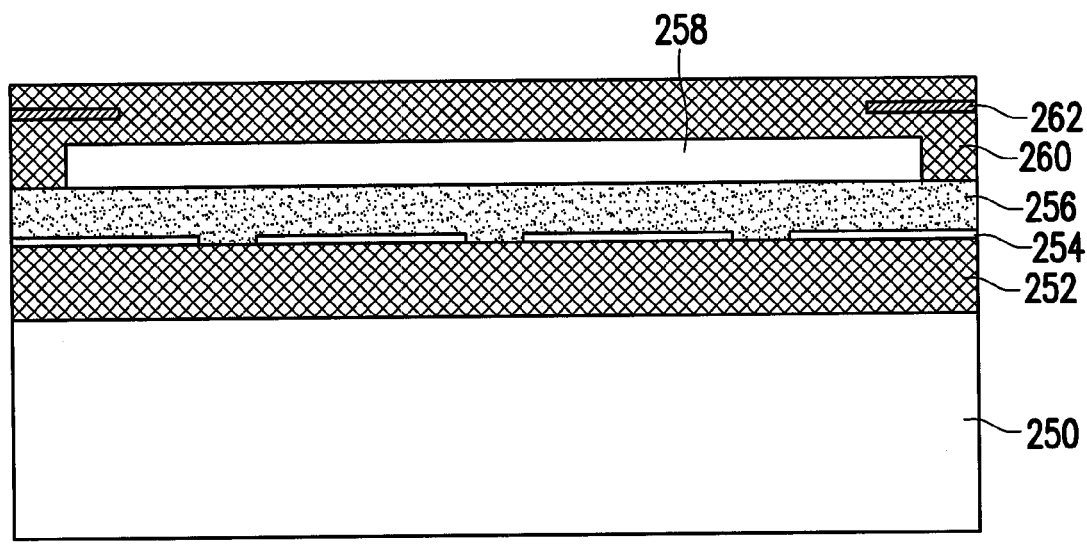

In FIG. 15B, a dielectric layer 256 is deposited over the hard mask layer 254. It should be noted that a dielectric etching rate of the hard mask layer 254 is lower than an etching rate of the dielectric layer 256. The effect of the etching rates will be seen in later isotropic etching process. A dielectric layer 260 is formed over the dielectric layer 256. The MEMS diaphragm 258 is embedded in the dielectric layer 260 on the dielectric layer 256. A mask layer 262 is also embedded in the dielectric layer 260 over the MEMS diaphragm 258.

Figure 15C:
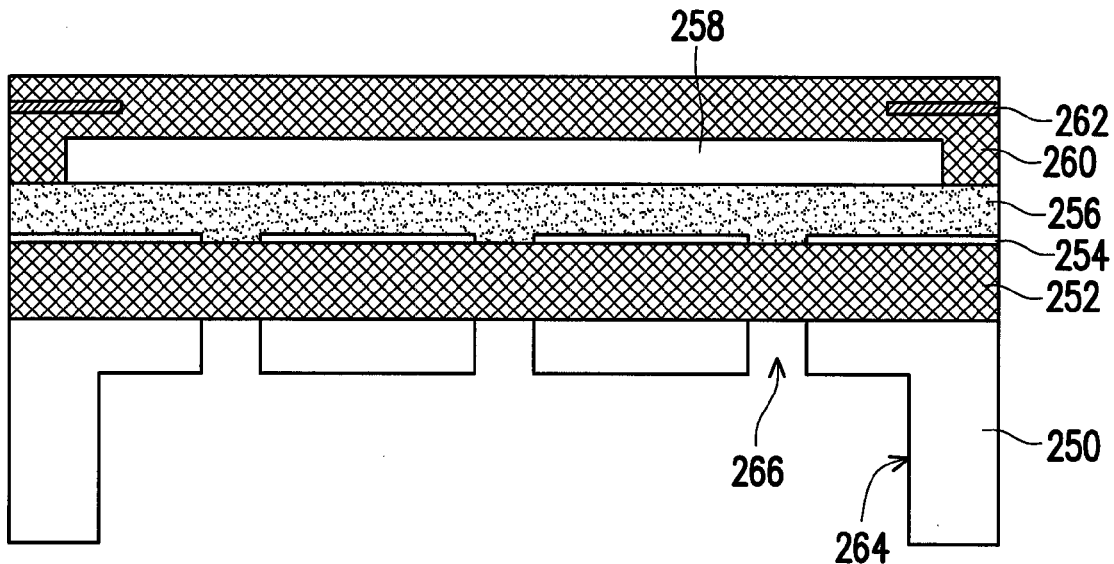

In FIG. 15C, the substrate 250 is patterned from the back surface to have an indent space defined by the sidewall 264 at the diaphragm region. The substrate 250 has also through holes 266 within the indent space to expose the dielectric layer 252. The process to pattern the substrate can be the manner as described in FIGS. 14B-14D, for example.

Figure 15D:
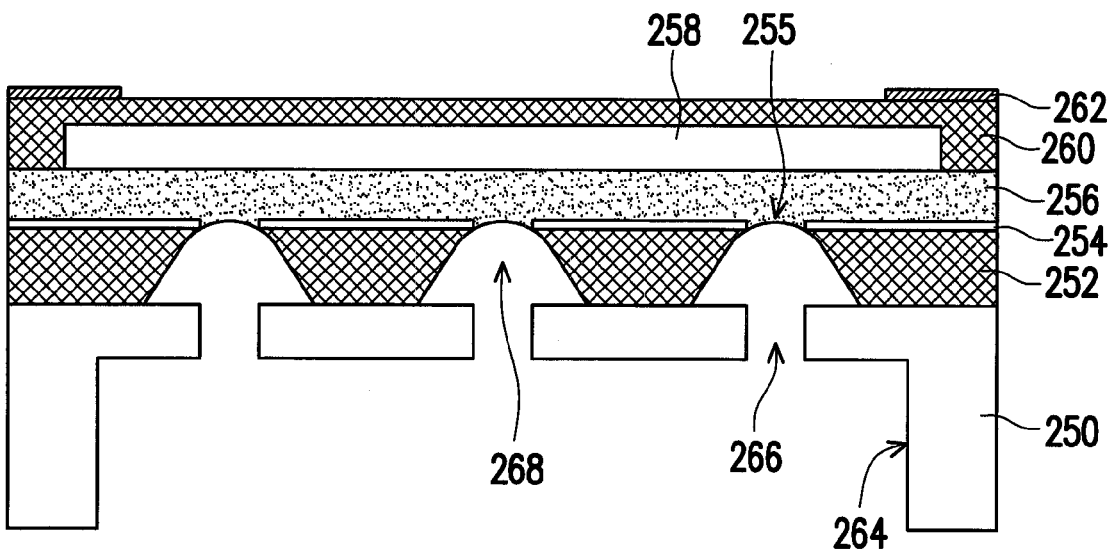

In FIG. 15D, an isotropic etching process is performed from both sides of the substrate 250 to etch the exposed portion of dielectric materials in various layers. The isotropic etching process from the second surface of the substrate 250 etches the dielectric layer 252 via the through holes 266, so that the dielectric layer 252 is etched starting from the exposed portion within the through holes 266, so that the preliminary openings 268 are formed. At the same time, the dielectric material of the dielectric layer 260 at the top is also etched to expose the etching mask layer 262. The etching mask layer 262 in the dielectric layer 260 is then used as the etching mask, so that a portion of the dielectric layer 260 is etched, in which the MEMS diaphragm at the top side may still be not exposed. The isotropic etching process continuously etches the dielectric layer 252 to expose the dielectric layer 256 at the openings 255 of the hard mask layer 254.

Figure 15E:
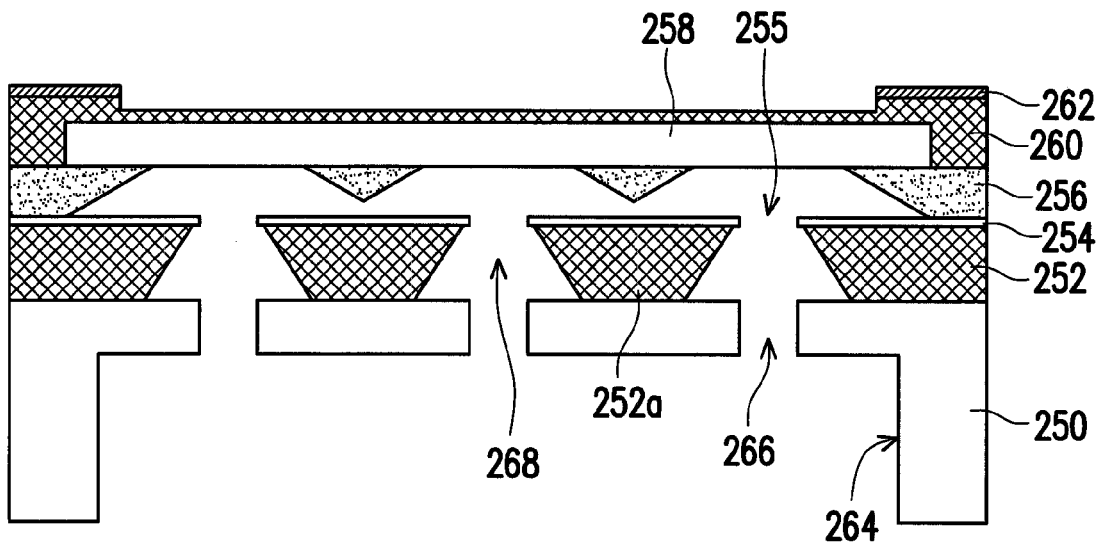

In FIG. 15E, the isotropic etching process is continuously performed to etch the exposed dielectric material in the dielectric layer 260, the dielectric layer 252, and the dielectric layer 256. The dielectric layer 260 at the top side is etched to expose the MEMS diaphragm 258. The dielectric layer 252 is etched to form a plurality of openings 268. The openings 268 have the slant sidewalls with larger apertures at the bottom to expose the through holes 266 of the substrate 250. The dielectric layer 256 with higher etching rate is etched from the openings 255. Once the dielectric layer 256 is exposed by the openings 255, the dielectric layer 256 is etched faster than the dielectric layer 252, so that a portion of the MEMS diaphragm has been exposed.

Figure 15F:
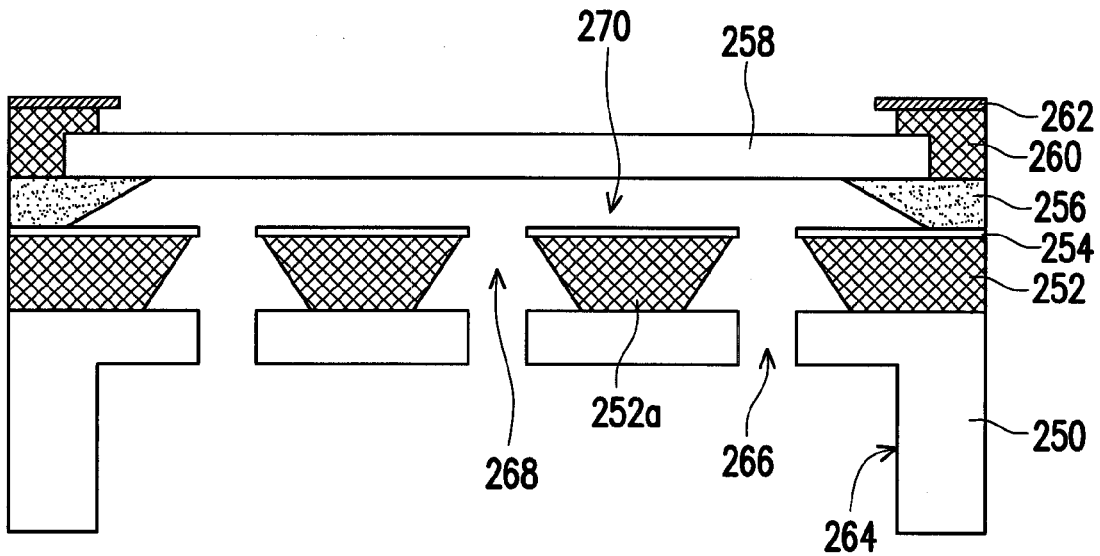

In FIG. 15F, the same isotropic etching process is still performed, so that the dielectric layer 256 is further etched to sufficiently expose the MEMS diaphragm 258, so that a chamber 270 is formed between the had mask layer 254 and the MEMS diaphragm 256. It can be noted that both the chamber 270 of the dielectric layer 256 and the openings 268 of the dielectric layer 254 have the slant sidewall due to the isotropic etching process, while the etching rates are properly set. The dielectric portion 252a of the dielectric layer 252 within the diaphragm region remains under the hard mask layer 254.

Further, another embodiment of fabrication method for the MEMS device is still provided. FIGS. 16A-16E are cross-sectional views, schematically illustrating another process flow to fabricate MEMS device, according to an embodiment of the invention.

Figure 16A:
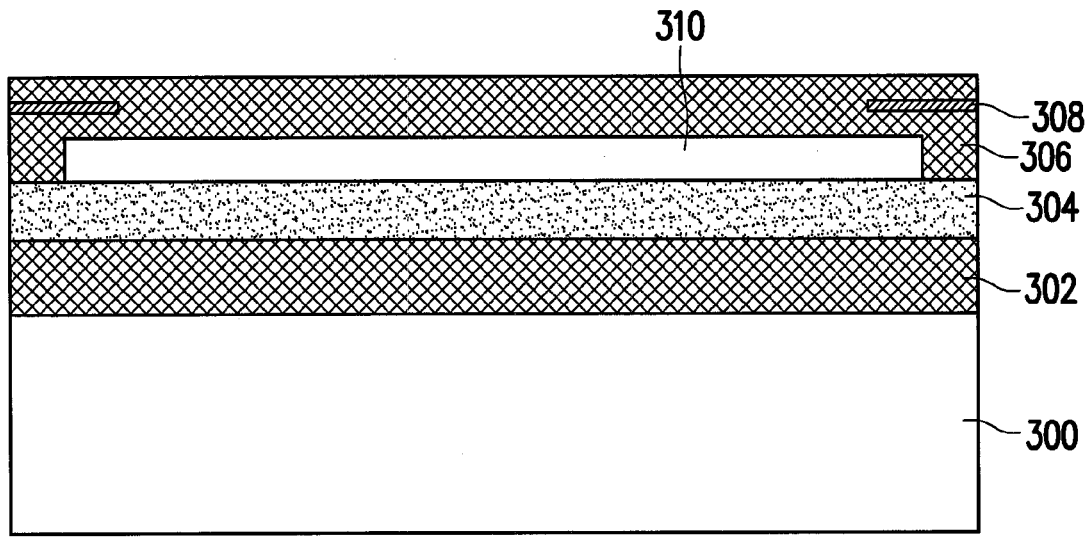
FIGS. 16A-16E are cross-sectional views, schematically illustrating another process flow to fabricate MEMS device, according to an embodiment of the invention.

In FIG. 16A, a substrate 300 is provided. The substrate 300 can be silicon substrate in an example. Usually, the thickness of the substrate is thick when comparing the size for the MEMS device. A dielectric layer 302, such as silicon oxide, is formed on the substrate 300 at the top surface, also referred as the first surface. The dielectric layer 302 may have other internal structure as described in previous structures of embodiment and can be known by person with ordinary skill in the art. However, the dielectric layer 302 is shown in single layer, as an example.

Another dielectric layer 304 is formed on the dielectric layer 304. The material of the dielectric layer 304 can be set to have a higher etching rate than the etching rate of the dielectric layer 302. The effect of the etching rates can be seen later when the isotropic etching process is performed later.

Then, a MEMS diaphragm 310 can be formed on the dielectric layer 304. In order to form the MEMS diaphragm 310, it usually needs the dielectric layer 306 with proper patterning process in fabrication. The dielectric layer 306 is a dielectric structural layer embedded with the MEMS diaphragm 310 and the etching mask layer 308. This internal dielectric structure can be known by the one with ordinary skill in the art. The MEMS diaphragm 310 can also be in other form, such as the corrugate diaphragm known in the art. In other words, the MEMS diaphragm 310 is represented by a flat single layer, generally. In addition, in order to expose the MEMS diaphragm 310 at the final product under the isotropic etching process, an etching mask layer 308 can be embedded in the dielectric layer 306.

Figure 16B:
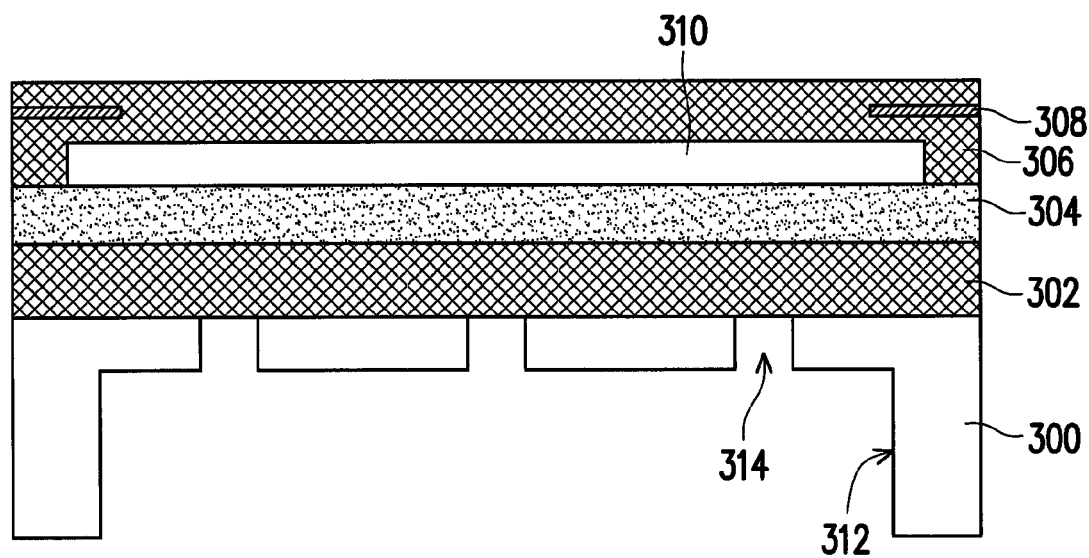

In FIG. 16B, the substrate 300 can be patterned from the second surface to have an indent space defined by the sidewall 312 at the diaphragm region. The substrate 310 is also patterned to have a plurality of through holes 314 within the indent space to expose the dielectric layer 302. The processes to pattern the substrate 300 can be the manner as described in FIGS. 14B-14D, for example.

Figure 16C:
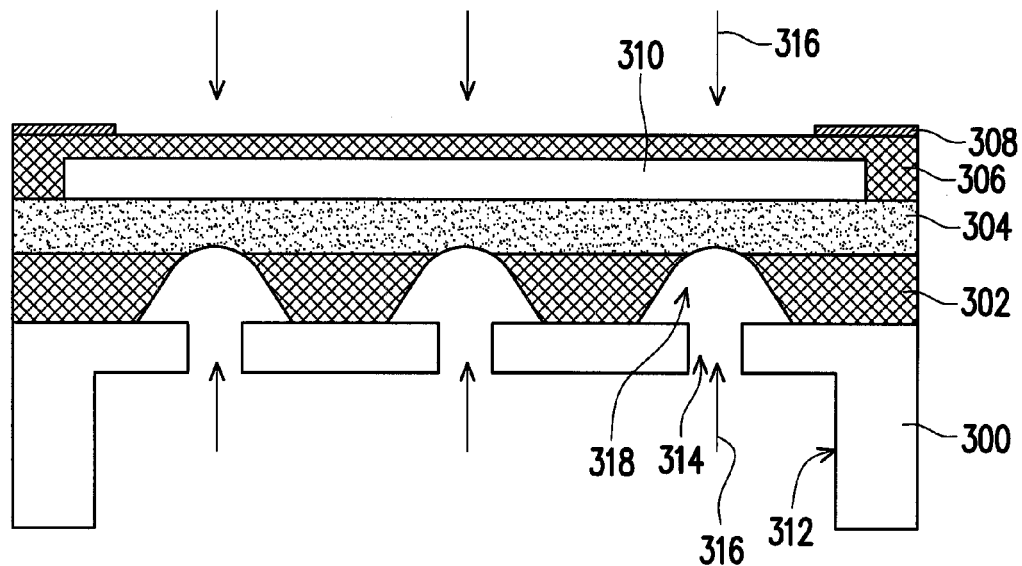

In FIG. 16C, an isotropic etching process 316 is performed over the substrate 300 from both sides, or the first surface and second surface of the substrate 300 to etch dielectric materials. The isotropic etching process 316 from the second surface of the substrate 300 etches the dielectric layer 302 via the through holes 314, so that the dielectric layer 302 is etched starting from the exposed portion within the through holes 314, so that the preliminary openings 318 are formed. At the same time, the dielectric material of the dielectric layer 306 at the top is also etched to expose the etching mask layer 308. The etching mask layer 308 in the dielectric layer 306 is then used as the etching mask, so that a portion of the dielectric layer 306 is etched, in which the MEMS diaphragm 310 at the top side may still be not exposed. The isotropic etching process 316 continuously etches the dielectric layer 302 to expose the dielectric layer 304.

Figure 16D:
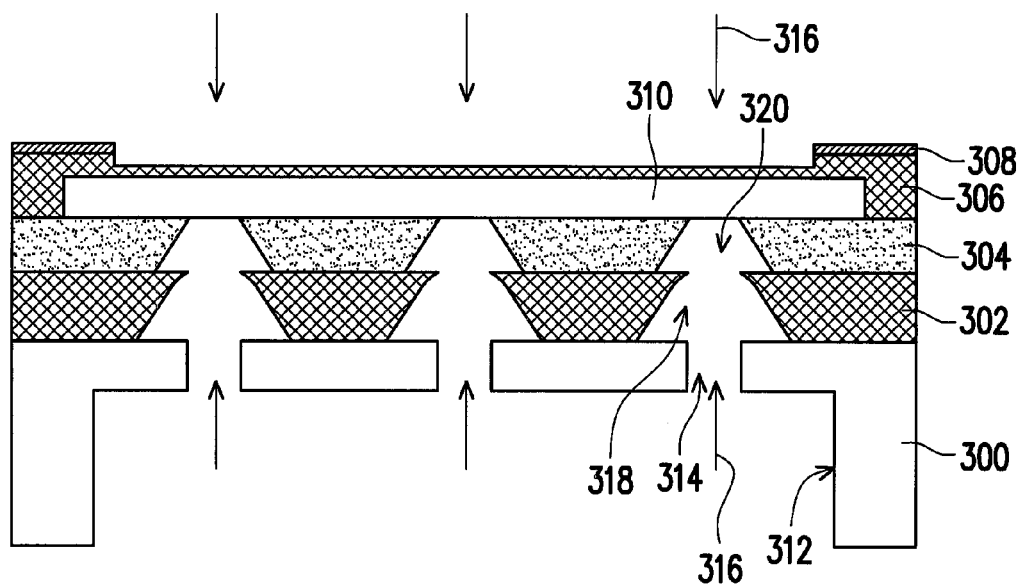

In FIG. 16D, the isotropic etching process 316 is still performed, so that the dielectric layer 304 starts to be etched via the opening 318. Because the etching rate of the dielectric layer 304 is larger than the etching rate of the dielectric layer 302, once the dielectric layer 304 is exposed by the dielectric layer 302, the dielectric layer 304 is etched much faster. A preliminary chamber 320 in the dielectric layer 304 is then formed to expose a portion of the MEMS diaphragm 310. At the top side, the dielectric layer 306 is etched, using the etching mask layer 308 as the mask. At this stage, the top side of the MEMS diaphragm 310 may still not be exposed.

Figure 16E:
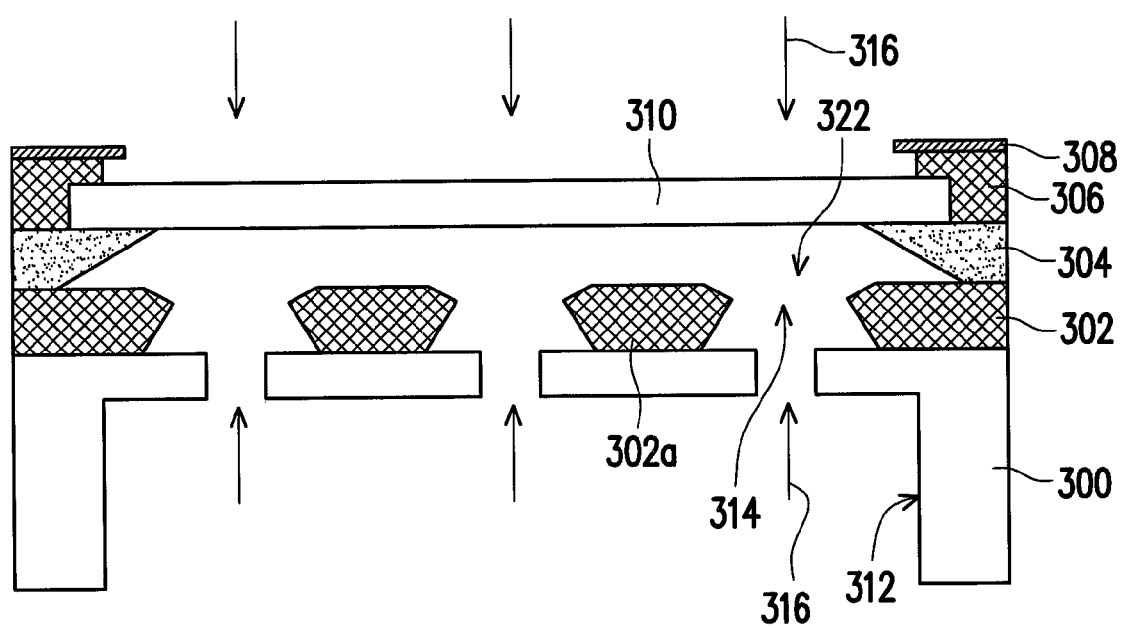

In FIG. 16E, the isotropic etching process 316 is continuously performed, so that the dielectric layer 306 is further etched to expose the MEMS diaphragm 310. The dielectric layer 304 is etched faster than the dielectric layer 302, so that the dielectric portion 302a still remains under the MEMS diaphragm 310.

It can be noted that only one isotropic etching process can form the MEMS structure. This is because the proper relation of the etching rates in different dielectric layers is set. The dielectric portion 302a can be formed after sufficient time for etching.

Another embodiment of fabrication process is further provided. FIGS. 17A-17F are cross-sectional views, schematically illustrating another process flow to fabricate MEMS device, according to an embodiment of the invention.

Figure 17A:
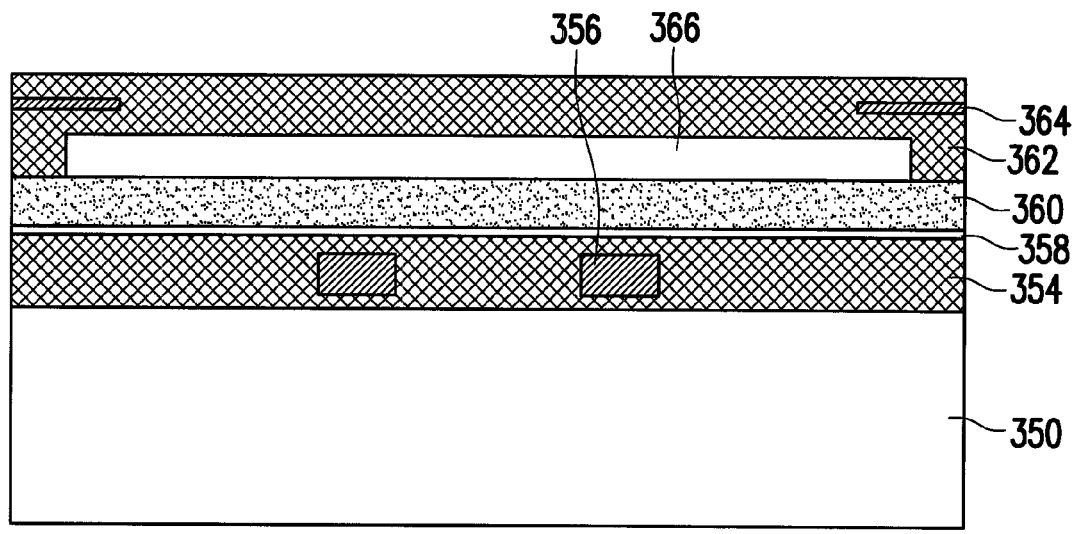
FIGS. 17A-17F are cross-sectional views, schematically illustrating another process flow to fabricate MEMS device, according to an embodiment of the invention.

In FIG. 17A, a substrate 350 is provided. The substrate 350 can be silicon substrate in an example. Usually, the thickness of the substrate 350 is thick when comparing the size for the MEMS device. A dielectric layer 354, such as silicon oxide, is formed on the substrate 350 at the top surface of the substrate 350, also referred as the first surface. The dielectric layer 354 may have other internal structure to adapt other structure elements, as described in previous structures of embodiment and can be known by person with ordinary skill in the art. However, the dielectric layer 302 is shown in single layer, as an example. A conductive plate 356 is embedded in the dielectric layer 354. The conductive plate 356 has a pattern with openings, which exposes the through holes of the substrate 350 to be formed later. The conductive plate 356 is like the conductive plate 142 in FIG. 9. A mask layer 358 is formed on the dielectric layer. A dielectric layer 360 is formed on the mask layer 354 with a larger etching rate than the mask layer 354. A dielectric layer 362 being structural is formed on the dielectric layer 360. The dielectric layer 362 is embedded with a MEMS diaphragm 366 and the etching mask layer 364, like previous descriptions.

Figure 17B:
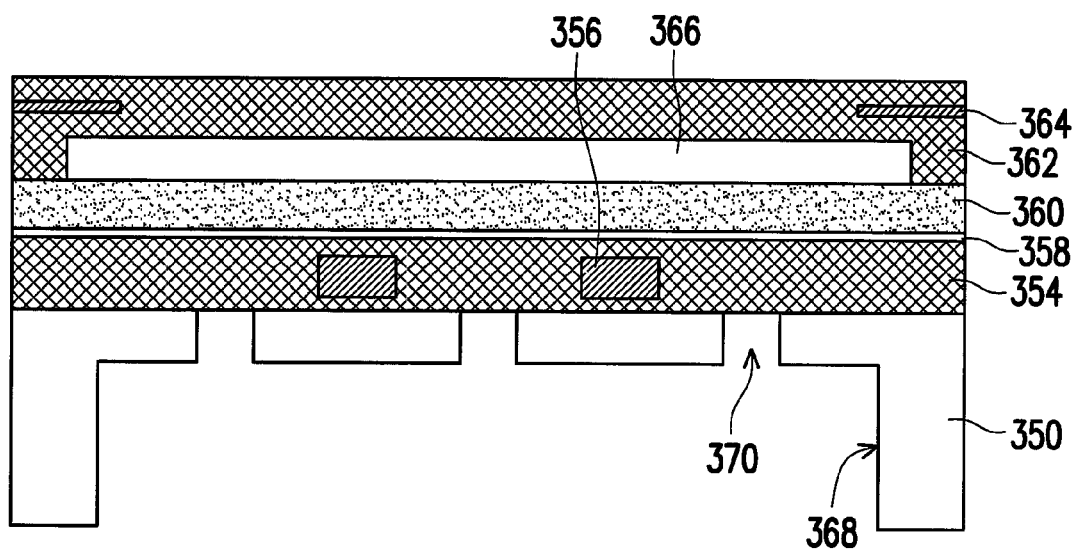

In FIG. 17B, the substrate 350 is patterned from the back surface to have an indent space defined by the sidewall 368 at the diaphragm region. The substrate 350 has also through holes 370 within the indent space to expose the dielectric layer 252. The process to pattern the substrate can be the manner as described in FIGS. 14B-14D, for example.

Figure 17C:
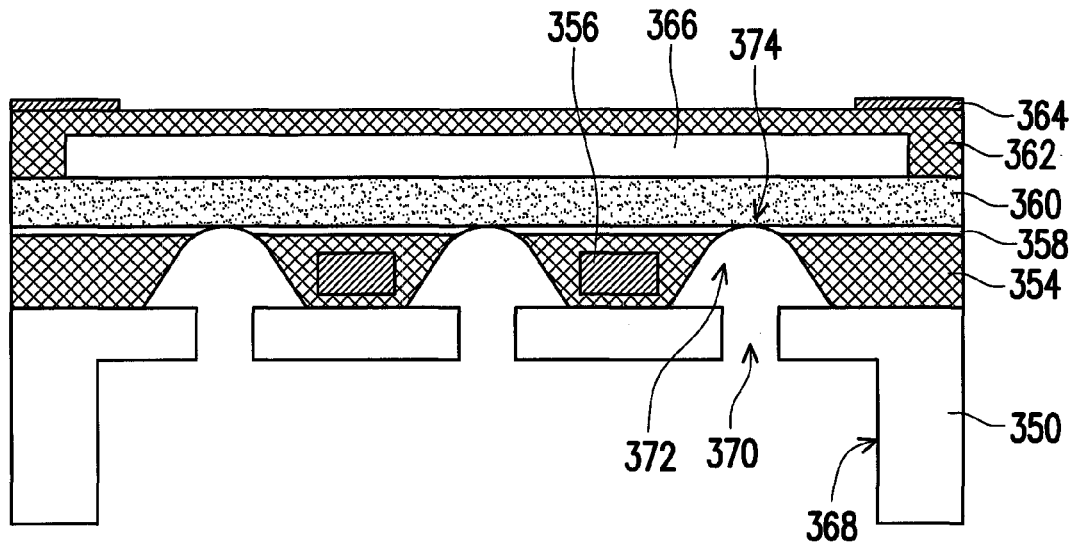

In FIG. 17C, an isotropic etching process is performed over the substrate 350 from both sides, or the first surface and second surface of the substrate 350 to etch dielectric materials. The isotropic etching process from the second surface of the substrate 350 etches the dielectric layer 354 via the through holes 370 of the substrate 350, so that the dielectric layer 354 is etched starting from the exposed portion within the through holes 370, so that the preliminary openings 372 are formed. The mask layer 358 is then etched to have a plurality of openings 374 to expose the dielectric layer 360. At the same time, the dielectric material of the dielectric layer 362 at the top is also etched to expose the etching mask layer 364. The etching mask layer 364 in the dielectric layer 362 is then used as the etching mask, so that a portion of the dielectric layer 362 is etched, in which the MEMS diaphragm 366 at the top side may still be not exposed. The isotropic etching process continuously etches the dielectric layer 354 up to the mask layer 354. The dielectric layer 360 is then exposed.

Figure 17D:
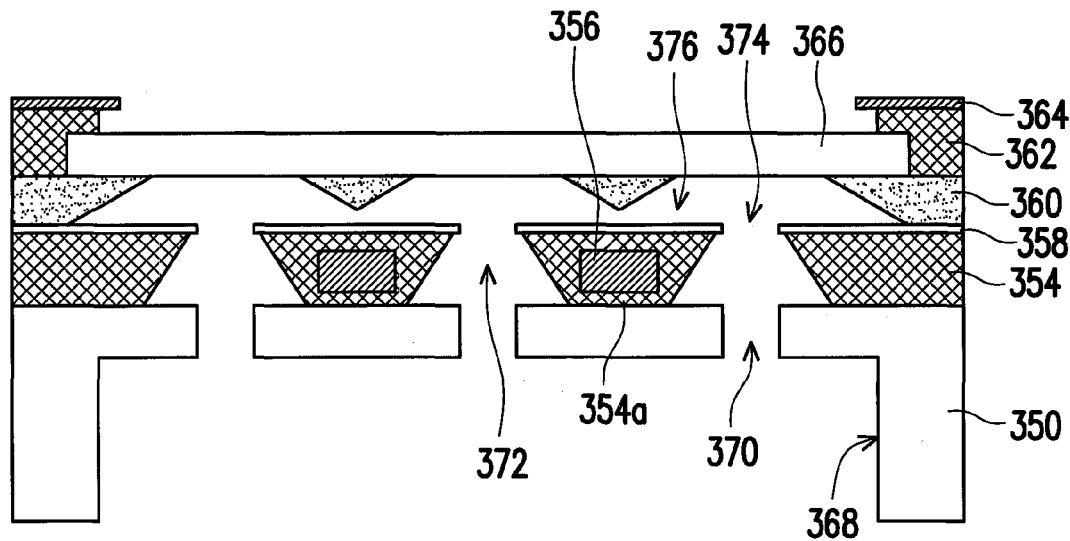

In FIG. 17D, the isotropic etching process is still performed, so that the dielectric layer 360 starts to be etched via the opening 374. Because the etching rate of the dielectric layer 360 is larger than the etching rate of the dielectric layer 354, once the dielectric layer 360 is exposed by the openings 374 of the mask layer 358, the dielectric layer 360 is etched much faster. A preliminary chamber 376 in the dielectric layer 360 is then formed to expose a portion of the MEMS diaphragm 366. At the top side, the dielectric layer 362 is etched, using the etching mask layer 364 as the mask. At this stage, the top side of the MEMS diaphragm 366 may or may still not be exposed. In this example, the top side of the MEMS diaphragm 366 is sufficiently exposed.

Figure 17E:
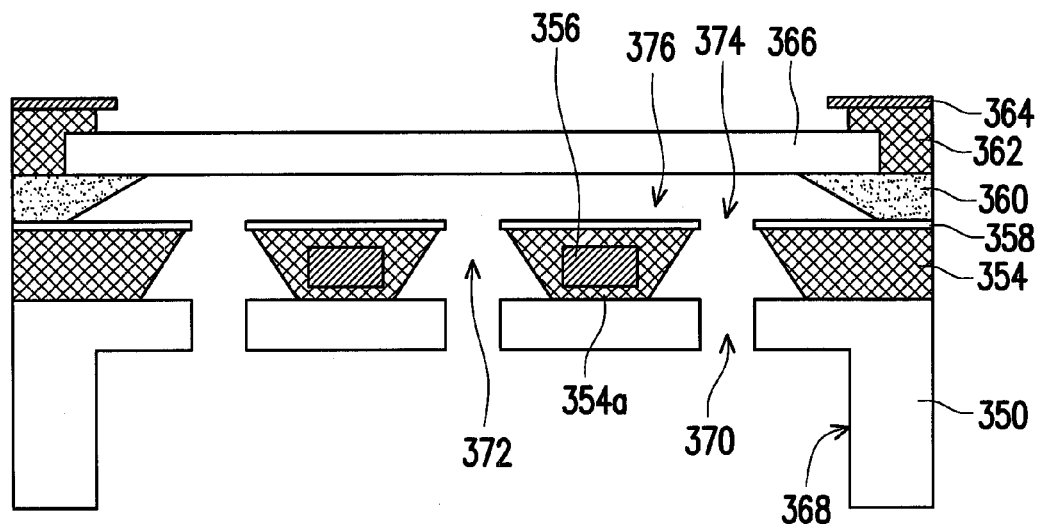

In FIG. 17E, the isotropic etching process is continuously performed, so that the dielectric layer 360 is further etched to expose the MEMS diaphragm 366. The dielectric layer 360 is etched faster than the dielectric layer 354, so that the dielectric portion 354a still remains under the mask layer 358 within the diaphragm of the MEMS diaphragm 366. As a result the chamber 376 is formed.

Figure 17F:
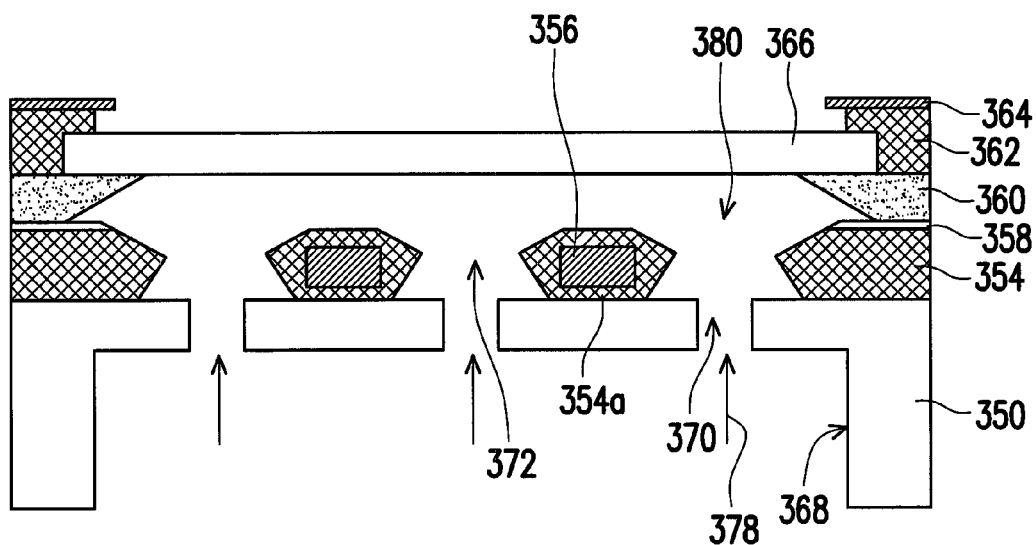

In FIG. 17F, if the mask layer 358 is not needed, the isotropic etching process can be performed further longer, so that the mask layer 358 above the dielectric portion 354a of the dielectric layer is removed.

Another embodiment of fabrication process is further provided. FIGS. 18A-18E are cross-sectional views, schematically illustrating another process flow to fabricate MEMS device, according to an embodiment of the invention.

Figure 18A:
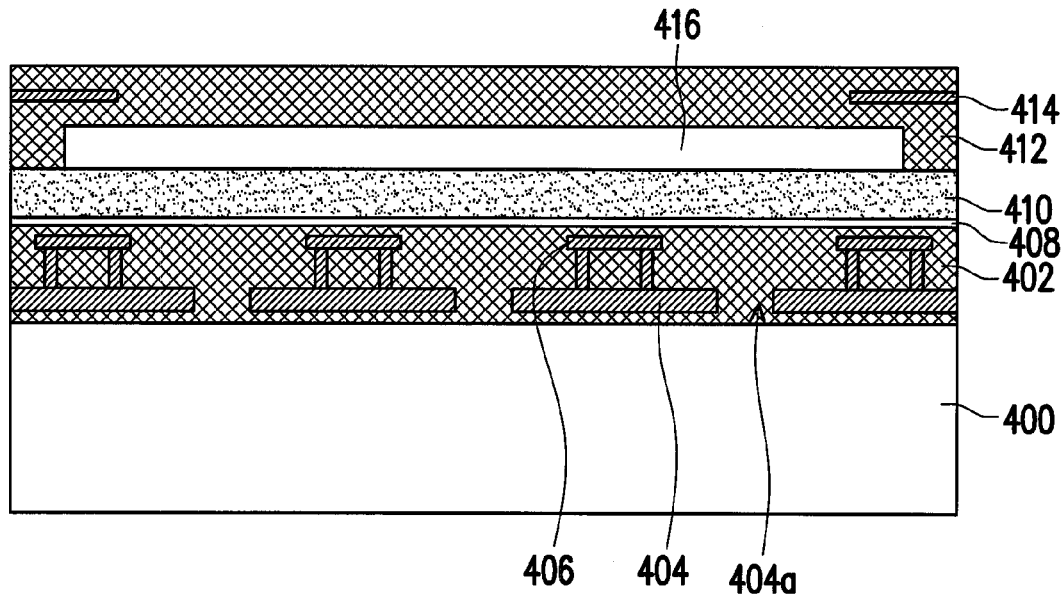
FIGS. 18A-18E are cross-sectional views, schematically illustrating another process flow to fabricate MEMS device, according to an embodiment of the invention.

In FIG. 18A, a substrate 400 is provided. A dielectric layer 402 being structural is formed on the substrate 400. The dielectric layer 402 has the internal structure, embedded with dielectric blocks 406 and a conductive plate 404. Each of the dielectric blocks 406 has multiple vertical walls contacting on the conductive plate 404 and a horizontal cap layer on the vertical walls. A dielectric material is surrounded in the vertical walls, the horizontal cap layer and the conductive plate 404. The conductive plate 404 has a plurality of through holes 404a. A mask layer 408 is formed on the dielectric layer 402. A dielectric layer 410 is formed on the mask layer 408. An etching rate of the mask layer 408 is lower than etching rates of the dielectric layer 410 and the dielectric layer 402. A dielectric layer 412 is formed over the dielectric layer 410. The dielectric layer 412 is embedded with a MEMS diaphragm 416 on the dielectric layer and the etching mask layer 414 over the MEMS diaphragm 416.

Figure 18B:
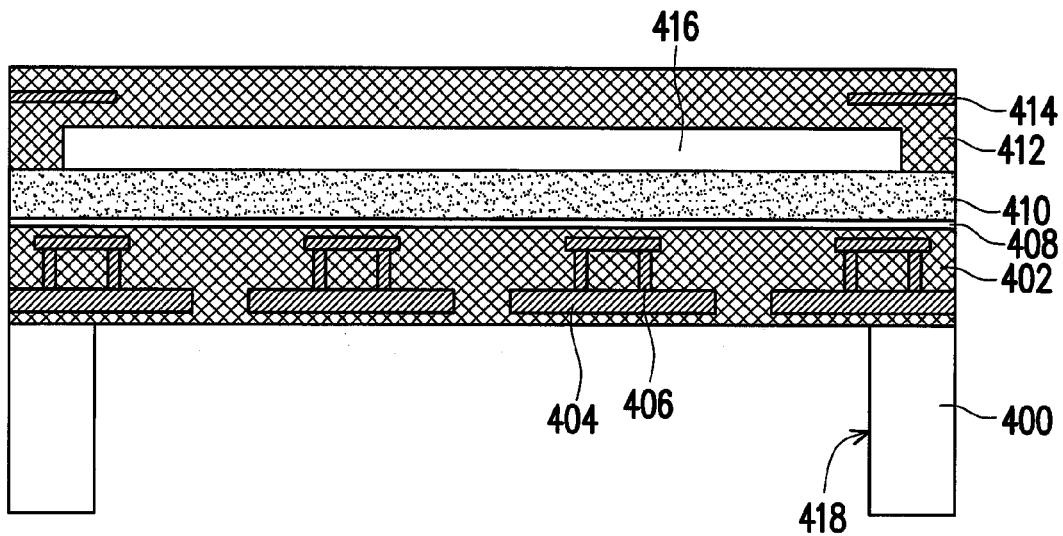

In FIG. 18B, the substrate is patterned to have an opening with a sidewall 418. The opening defined by the sidewall 418 exposes the dielectric layer 402.

Figure 18C:
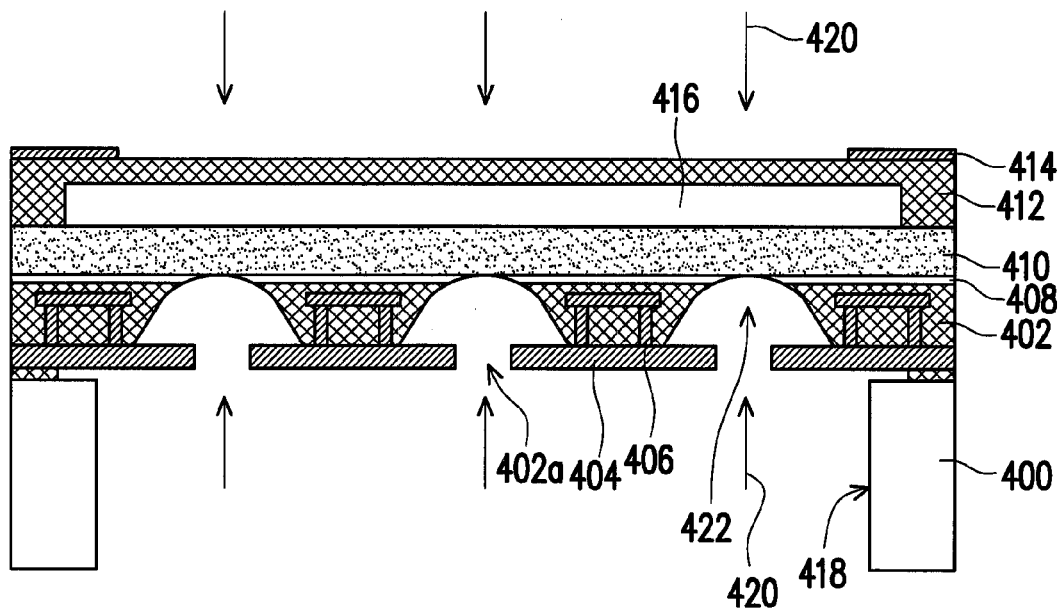

In FIG. 18C, an isotropic etching process 420 is performed from both sides, or the first surface and the second surface of the substrate 400. From the second surface of the substrate 400, the isotropic etching process 420 etches the dielectric layer 402 to expose the conductive plate 404 and expose the through holes 402a. The dielectric layer 402 is then further etched via the through hole 402a of the conductive plate 404 and a plurality of openings 422 are formed in the dielectric layer 402 without exposing the dielectric blocks 406. The mask layer 408 is also etched to have a plurality of openings. The dielectric layer 412 at top side is also etched to expose the etching mask layer 414.

Figure 18D:
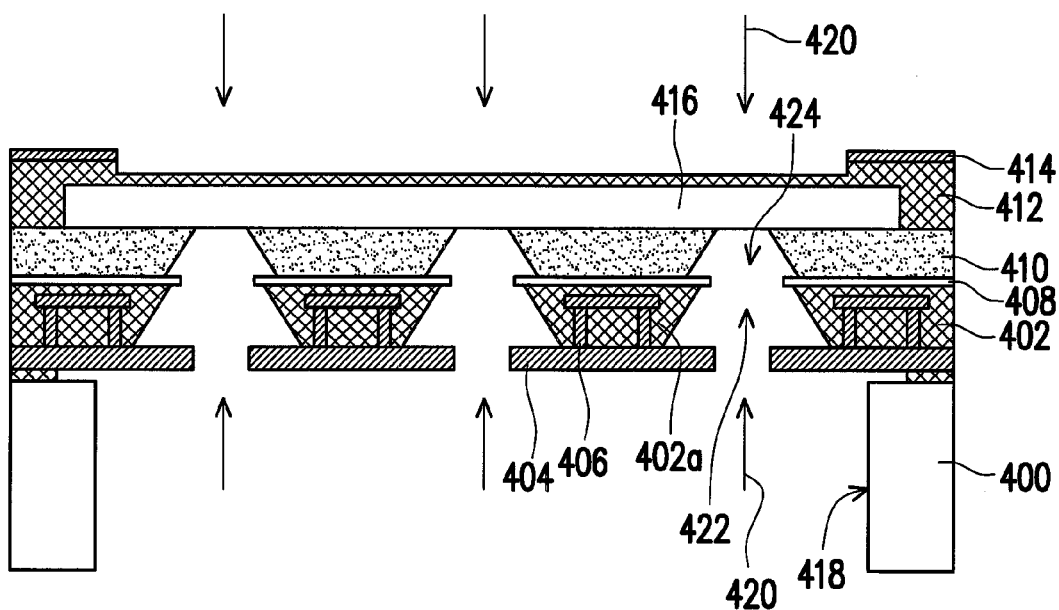

In FIG. 18D, the isotropic etching process 420 continues to etch the exposed dielectric materials. As a result, the mask layer 408 is etched to have larger openings, which allow the dielectric layer 410 to be etched. Because the etching rate of the dielectric layer 410 is larger than the dielectric layer 402 and the mask layer 408, the dielectric layer 410 is etched much faster. A preliminary chamber 424 is then formed in the dielectric layer 410. At op side, the dielectric layer 412 is further etched while the etching mask layer 414 is used as the etching mask. At this stage, the MEMS diaphragm 416 may still not be exposed.

Figure 18E:
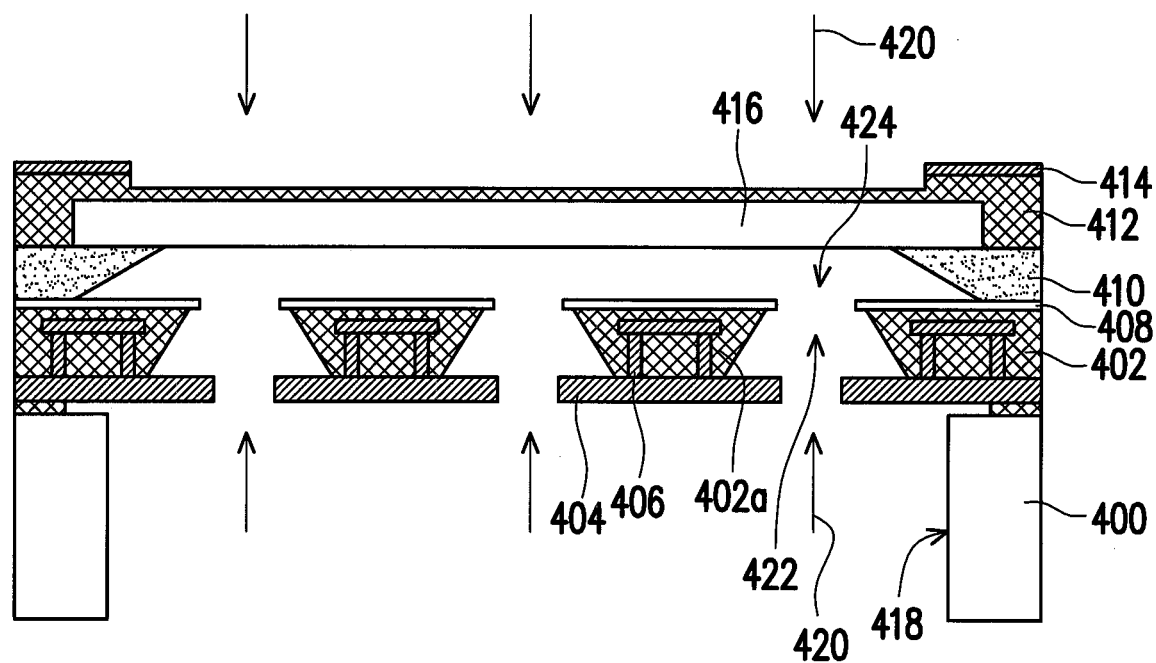

In FIG. 18E, the isotropic etching process 420 continues to etch the exposed dielectric materials, so that the chamber 424 is formed in the dielectric layer 410. The dielectric portion 402a of the dielectric layer 402 under the mask layer 408 still remains.

It should also be noted that the conductive plate 404 can be directly formed on the substrate 400 by another patterning process.

FIGS. 19A-19E are cross-sectional views, schematically illustrating another process flow to fabricate MEMS device, according to an embodiment of the invention.

Figure 19A:
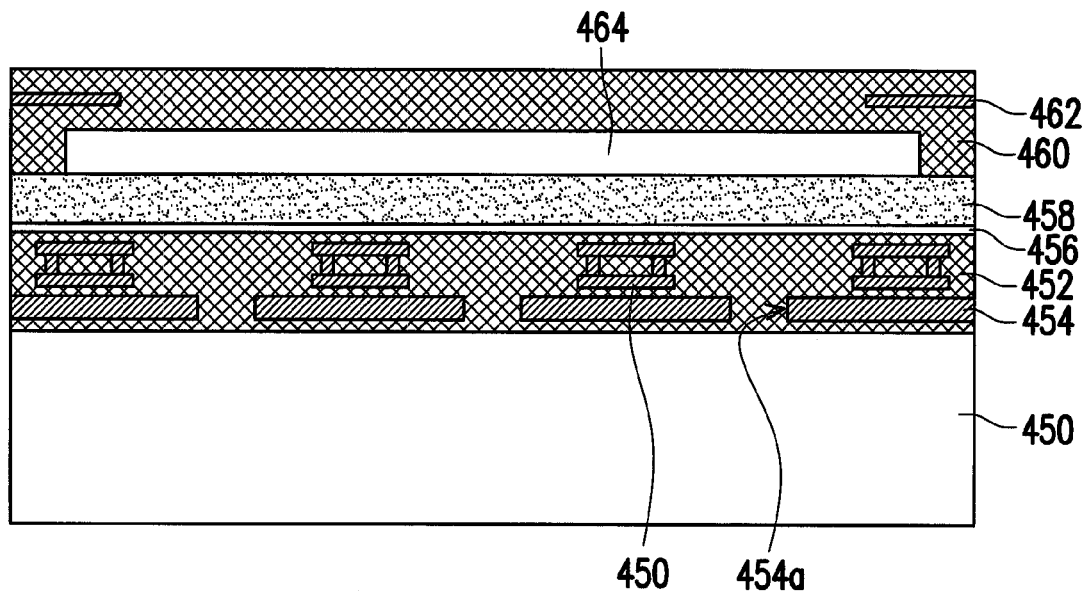
FIGS. 19A-19E are cross-sectional views, schematically illustrating another process flow to fabricate MEMS device, according to an embodiment of the invention.

In FIG. 19A, a substrate 450 is provided. A dielectric layer 452 being structural is formed on the substrate 450. The dielectric layer 452 has the internal structure, embedded with a rigid supporting layer 454, dielectric blocks 450. Each of the dielectric blocks 450 has multiple vertical walls and two horizontal cap layers on the vertical walls, for example. The dielectric blocks 450 in this embodiment may not contact on the supporting plate 454. A dielectric material is surrounded in the vertical walls and the two horizontal cap layers. The supporting plate 454 has a plurality of through holes 454a. A mask layer 456 is formed on the dielectric layer 452. A dielectric layer 458 is formed on the mask layer 456. An etching rate of the mask layer 456 is lower than etching rates of the dielectric layer 458 and the dielectric layer 452. A dielectric layer 460 being is formed over the dielectric layer 458. The dielectric layer 460 is embedded with a MEMS diaphragm 464 on the dielectric layer 458 and the etching mask layer 462 over the MEMS diaphragm 464.

Figure 19B:
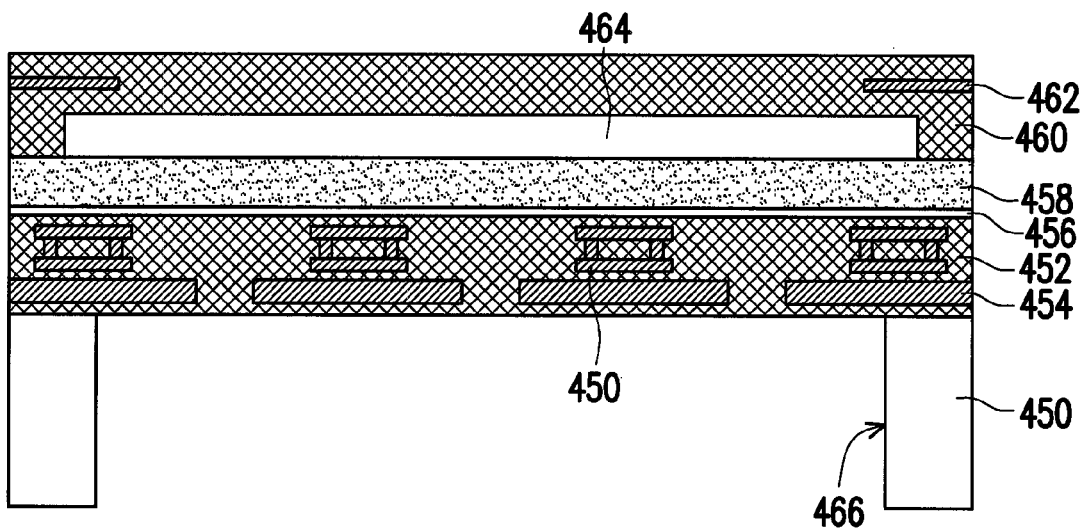

In FIG. 19B, the substrate 450 is patterned to have an opening with a sidewall 466. The opening defined by the sidewall 466 exposes the dielectric layer 452.

Figure 19C:
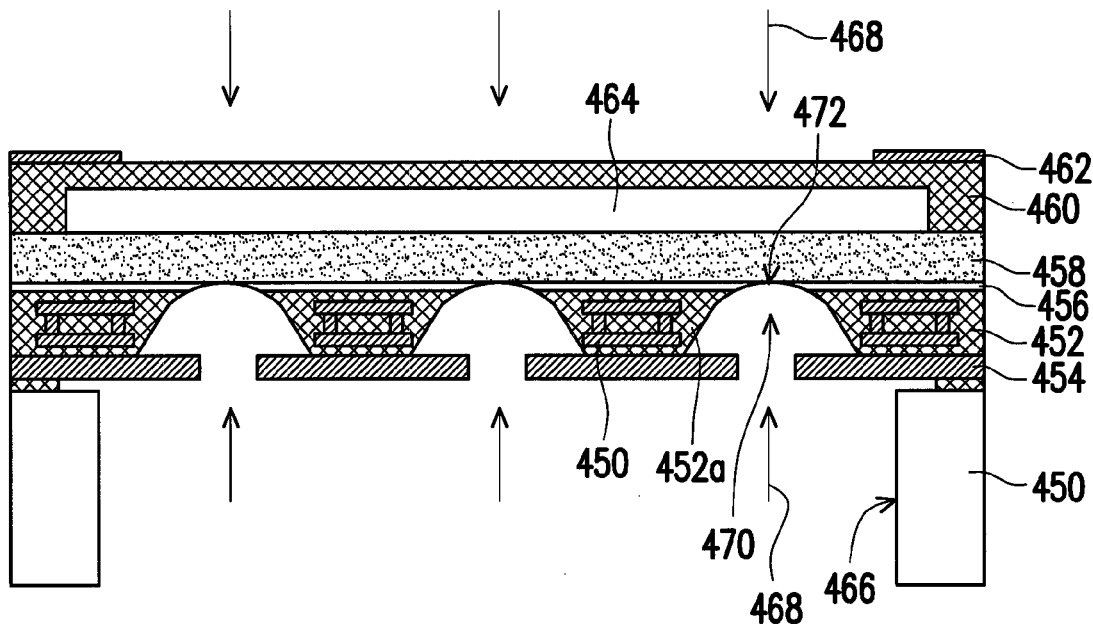

In FIG. 19C, an isotropic etching process 468 is performed from both sides, or the first surface and the second surface of the substrate 450. From the second surface of the substrate 450, the isotropic etching process 468 etches the dielectric layer 452 to expose the supporting plate 454 and expose the through holes 452a. The dielectric layer 452 is then further etched via the through holes 452a of the supporting plate 454 and a plurality of openings 470 are formed in the dielectric layer 452 without exposing the dielectric blocks 450. The mask layer 456 is also etched to have a plurality of openings 472. The dielectric layer 460 at top side is also etched to expose the etching mask layer 462.

Figure 19D:
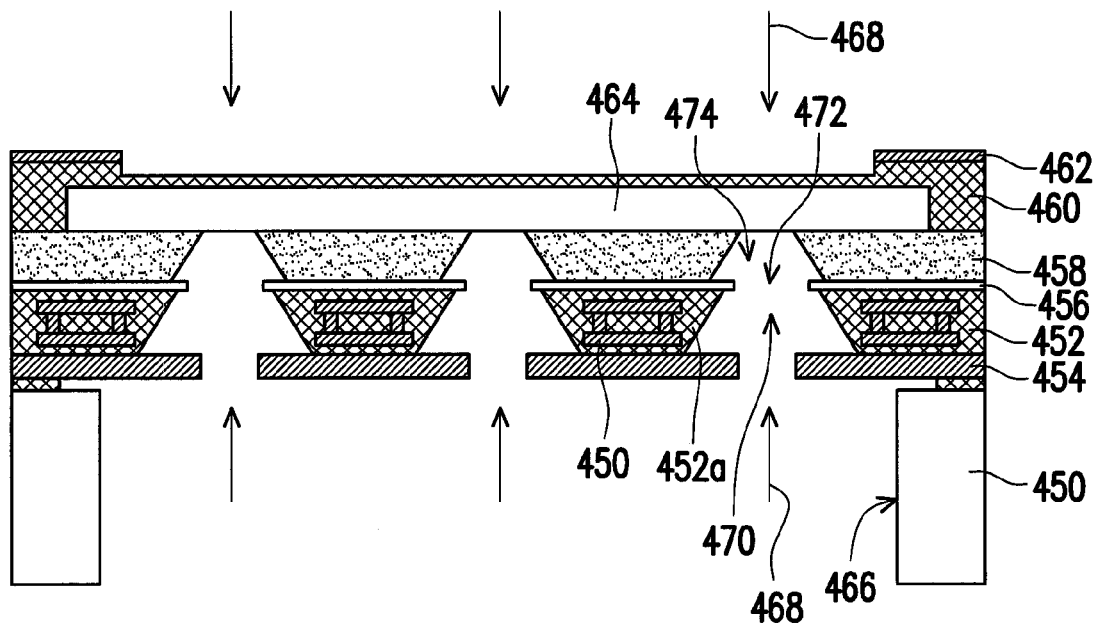

In FIG. 19D, the isotropic etching process 468 continues to etch the exposed dielectric materials in the MEMS device. As a result, the mask layer 456 is etched to have larger openings 472, which allow the dielectric layer 458 to be etched. Because the etching rate of the dielectric layer 458 is larger than the dielectric layer 452 and the mask layer 456, the dielectric layer 458 is etched much faster. A preliminary chamber 474 is then formed in the dielectric layer 458. At op side, the dielectric layer 460 is further etched while the etching mask layer 462 is used as the etching mask. At this stage, the MEMS diaphragm 464 may still not be exposed.

Figure 19E:
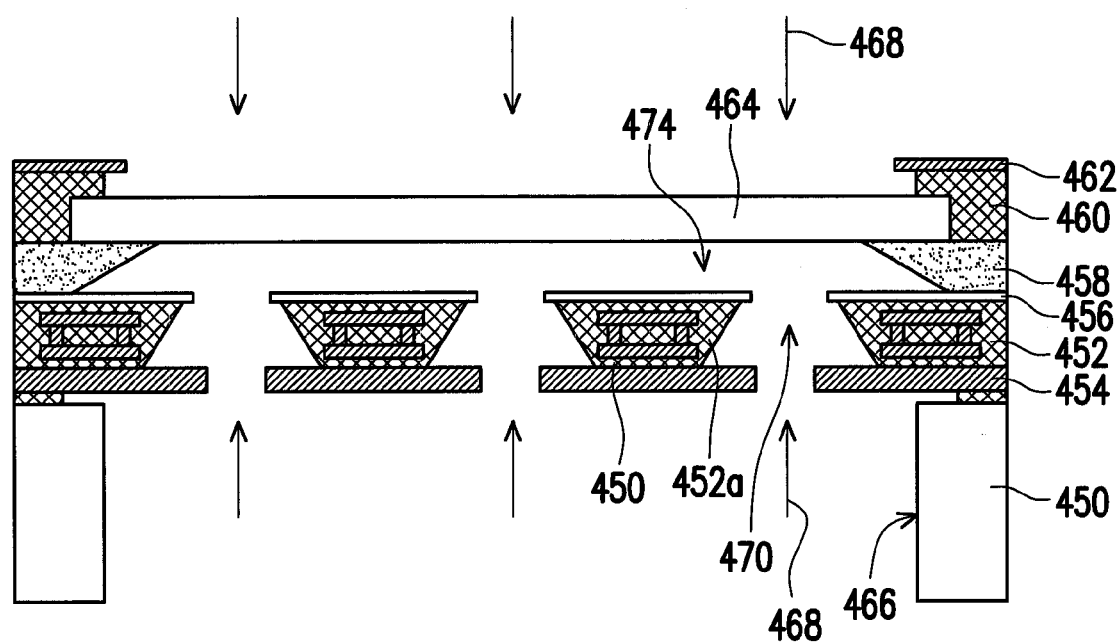

In FIG. 19E, the isotropic etching process 468 continues to etch the exposed dielectric materials, so that the chamber 474 is formed in the dielectric layer 458. The MEMS diaphragm 464 is sufficiently exposed. The dielectric portion 452a of the dielectric layer 452 under the mask layer 456 still remains. The dielectric blocks 450 are embedded in the dielectric portion 452a. The supporting plate 454 in this embodiment is to provide the mechanical support. The material of the supporting plate 454 can be conductive or non-conductive.

It should also be noted that the conductive plate 404 can be directly formed on the substrate 450 by another patterning process.

Further, FIGS. 20A-20H are cross-sectional views, schematically illustrating another process flow to fabricate MEMS device, according to an embodiment of the invention. The fabricating process can form the structure shown in FIG. 5C.

Figure 20A:
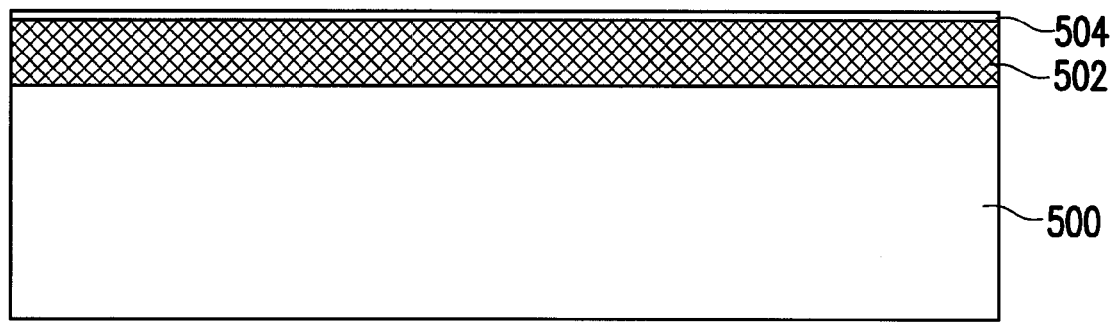
FIGS. 20A-20H are cross-sectional views, schematically illustrating another process flow to fabricate MEMS device, according to an embodiment of the invention.
Figure 20B:
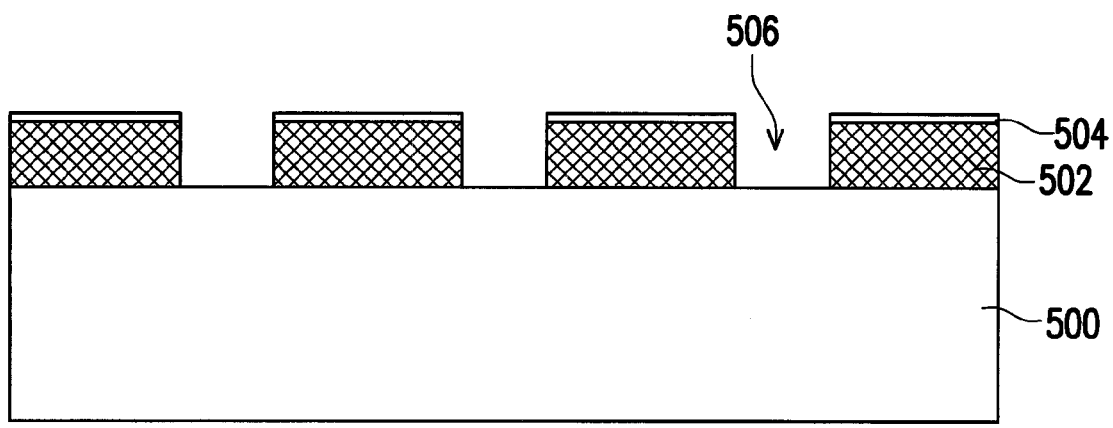

In FIG. 20A, a substrate 500, such as a silicon substrate, is provided. A dielectric layer 502 is formed on the substrate 500. A mask layer 504 is formed on the dielectric layer 502. In FIG. 20B, the mask layer 504 and the dielectric layer 502 are patterned by photolithographic process and etching process to form openings 506 in the mask layer 504 and the dielectric layer 502 to expose the substrate 500. The photolithographic process including forming a photoresist layer and developing the photoresist layer as a mask pattern to serve as the etching mask. Then, an anisotropic etching process can be performed to etch the mask layer 504 and the dielectric layer 502 to form the openings 506.

Figure 20C:
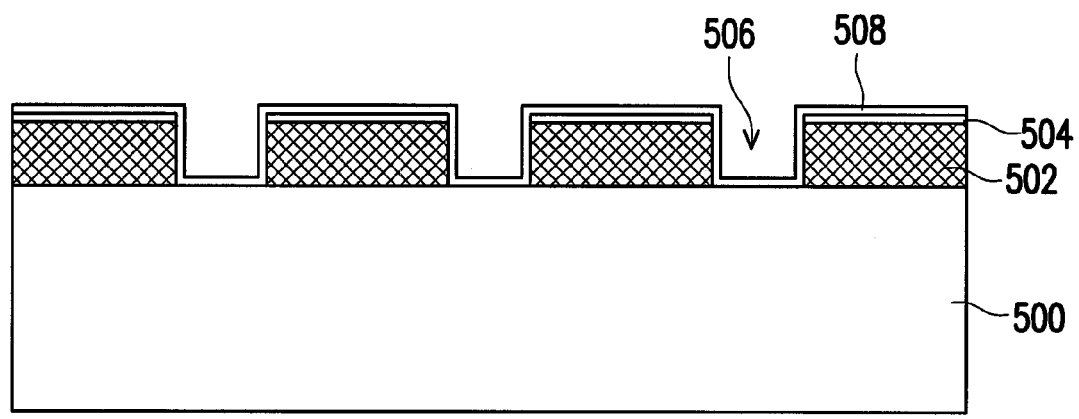
Figure 20D:
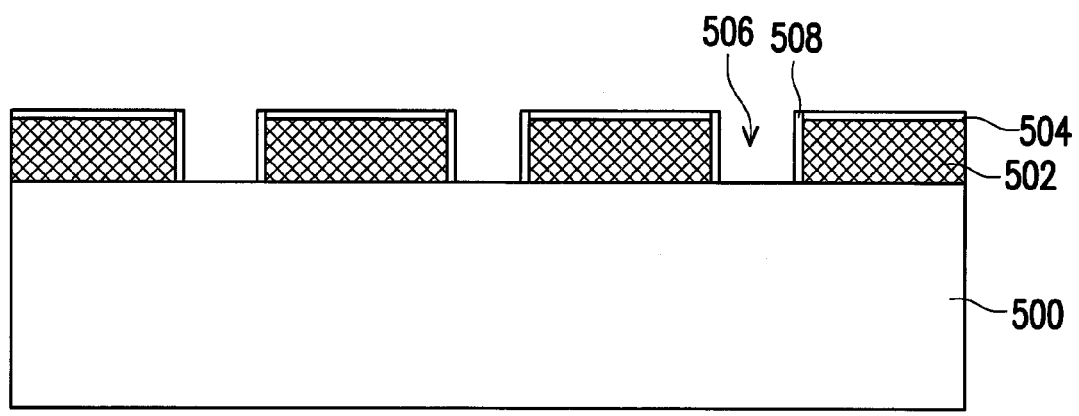

In FIG. 20C, another mask layer 508 is formed over the substrate 500 and the dielectric layer 502, wherein the sidewalls of the openings 506 is also covered by the mask layer 508. In FIG. 20D, an anisotropic etching process as the etching back process is performed to etch the mask layer 508 to expose the substrate 500 again. The residual portion of the mask layer 508 serves as a spacer on the sidewall of the openings 506. The mask layer 508 as the spacer is combined with the mask layer 504 as single mask layer to cover the dielectric layer 502.

Figure 20E:
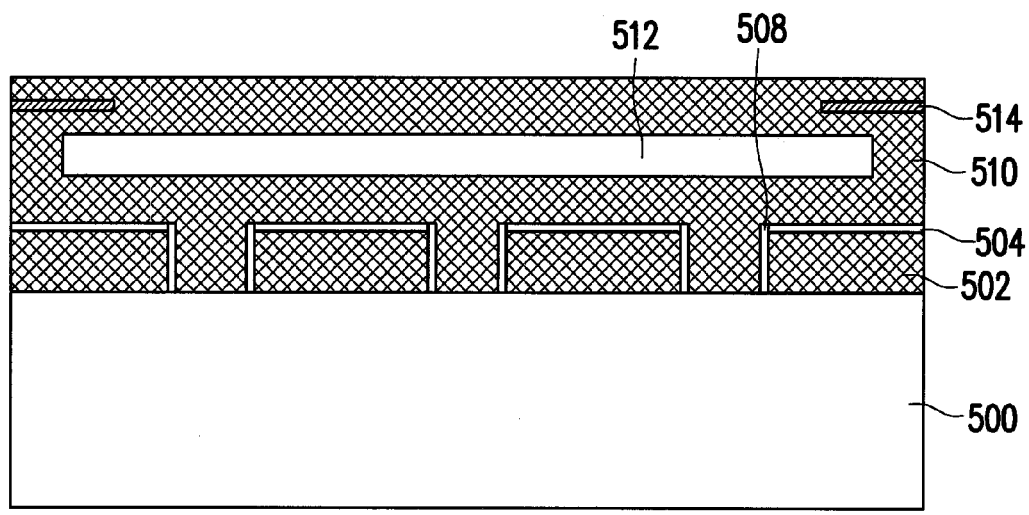

In FIG. 20E, a dielectric layer 510 is formed over the substrate 500 and the mask layer 504 and 508. The openings 506 in the dielectric layer 502 are also filled. In addition, the diaphragm 512 is embedded in the dielectric layer 510. Another etching mask layer 514 is embedded in the dielectric layer 510 surrounding the diaphragm 512 from top view.

Figure 20F:
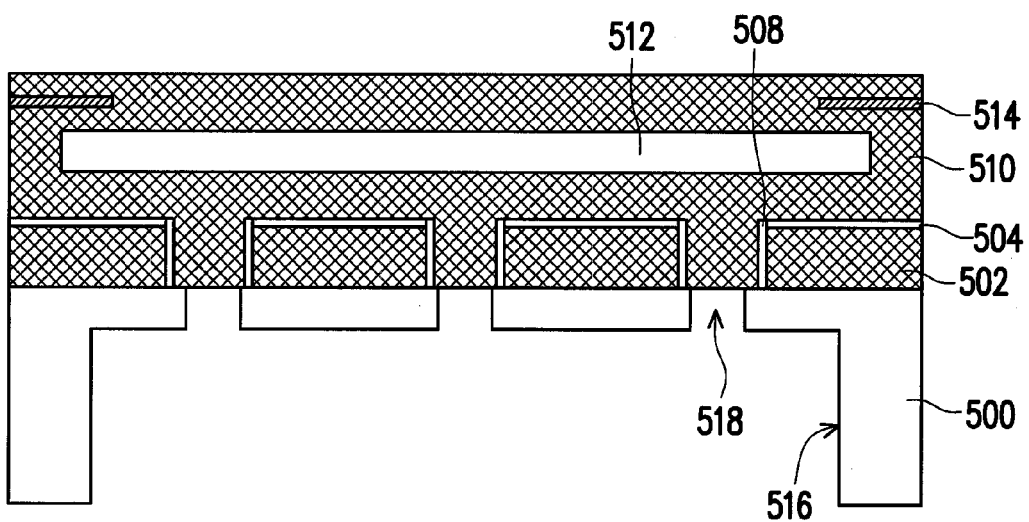

In FIG. 20F, like the process as been already described, the substrate 500 is patterned from the bottom surface to have the indent space, optionally. The indent space corresponding the diaphragm region is defined by the sidewall 516. The substrate 500 is also patterned to have the through holes 518 to expose the dielectric layer 502 at the region between the spacer 508. To pattern the substrate 500, the photolithographic process and anisotropic etching process can be performed.

Figure 20G:
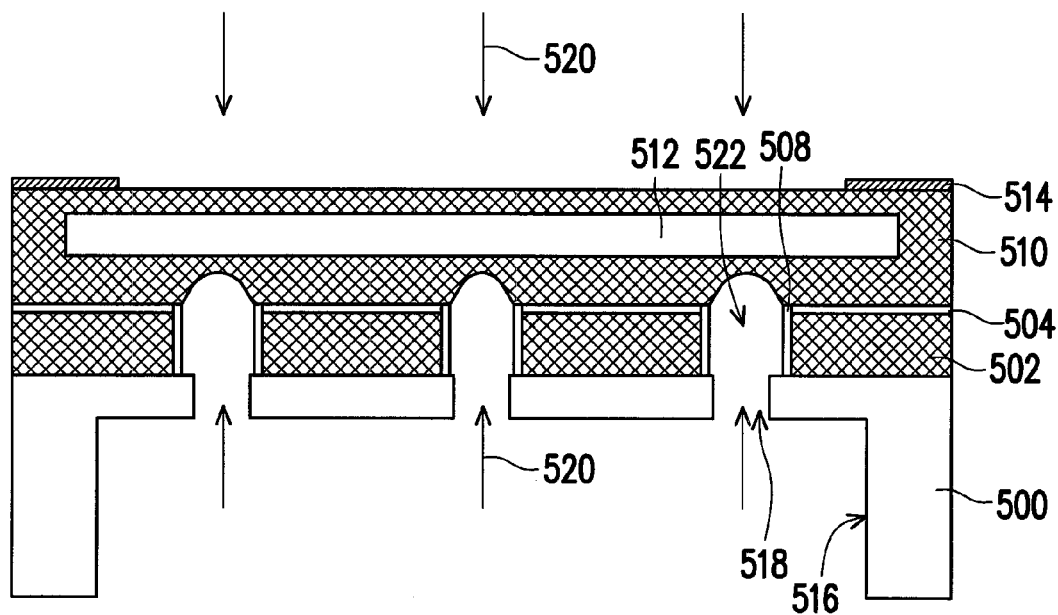
Figure 20H:
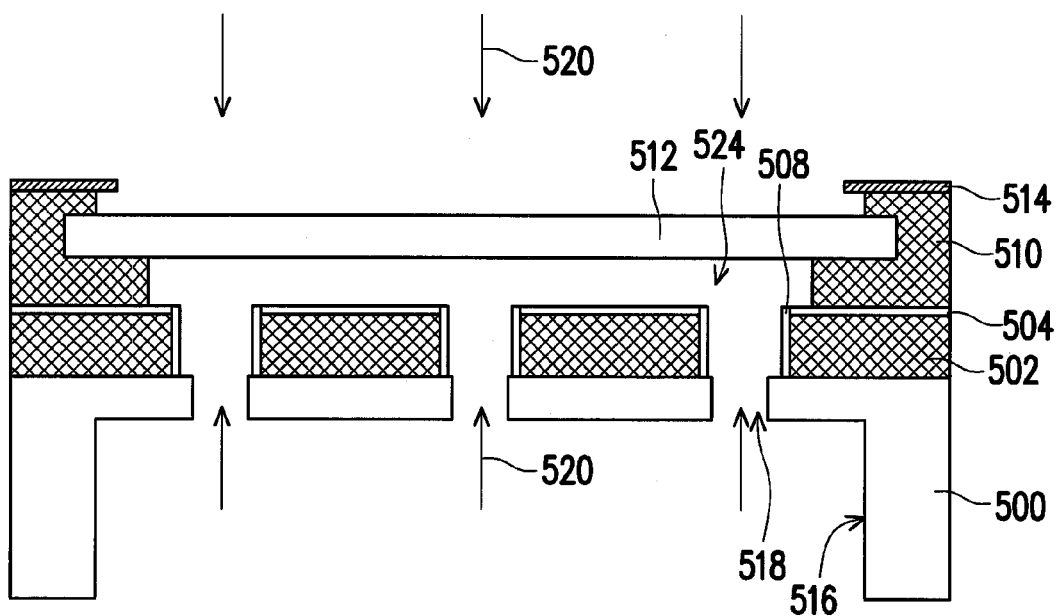

In FIG. 20G, an isotropic etching process 520, such as wet etching process, for dielectric material is performed from both sides of the substrate 500, so that the dielectric material in the MEMS device is etched. In the beginning stage, a portion of the dielectric layer 510 is etched and the etching mask layer 514 is exposed. The etching mask layer 514 serves as the mask on the dielectric layer 502 under the etching process 520. From the bottom side of the substrate 500, the exposed portion of the dielectric layer 510 filled inside the openings 516 (see FIG. 20B) is etched first while the dielectric layer 502 covered by the mask layer 504 and spacer 508 is not etched. As a result, the preliminarily openings 522 corresponding to the openings 516 are formed in the dielectric layer 510 at the beginning stage. The openings 516 in the dielectric layer 502 appear again.

The isotropic etching process is continuously performed, then the preliminarily openings 522 expend as the chamber 524, and the diaphragm 512 is exposed and released to sense the air pressure, for example. The end periphery of the diaphragm 512 is still held by the dielectric layer 510. The chamber 524 connects to the environment by the opening 506 defined by the spacer 508 and the through holes 518.

In this embodiment, the opening is already formed by the anisotropic etching process in the dielectric layer 502. The sidewall of the opening 506 is not slant. The mask layer covers the exposed surface of the dielectric layer 502, so that the isotropic etching process at the later step is just etching the dielectric material of the dielectric layer 510. The different process also results in the different profile structure of the opening 506. However, the effect to increase the capacitance of the MEMS device still remains.

The present invention proposes the MEMS device, of which the capacitance can be increased without changing the gap distance d. The increase of capacitance is achieved by increasing the averaged dielectric constant of the MEMS capacitor. In addition, the effective gap distance can also be reduced by the dielectric portion. The current leakage on the surface of the sidewall can also be reduced.

In order to have the proposed structure, several fabrication processes are also provided, in which only the same one of isotropic etching process is needed because the proper setting of dielectric etching rate for different dielectric layer.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A Micro-Electro-Mechanical Systems (MEMS) device, comprising:
   a substrate, having a diaphragm opening at a diaphragm region;
   a supporting layer, being conductive without dielectric material, disposed over the substrate to cover the diaphragm opening, wherein a first side of the supporting layer is exposed to the diaphragm opening, wherein the supporting layer has a plurality of through holes within the diaphragm region, so that the through holes of the supporting layer are connected with the diaphragm opening;
   a first dielectric structural layer, disposed on a second side of the supporting layer, wherein the first dielectric structural layer has a plurality of openings corresponding to the through holes, wherein each of the through holes remains exposed by the first dielectric structural layer;
   a second dielectric structural layer with a chamber, disposed over the first dielectric structural layer, wherein the chamber exposes the openings of the first dielectric structural layer; and
   a MEMS diaphragm, embedded in the second dielectric structural layer above the chamber, wherein an air gap is formed between the supporting layer and the MEMS diaphragm.

2. The MEMS device of claim 1, wherein each one of the openings of the first dielectric structural layer has a slant sidewall, so that each one of the openings has a first aperture close to the substrate and a second aperture close to the second dielectric structural layer, the first aperture is wider than the second aperture.

3. The MEMS device of claim 1, wherein the chamber of the second dielectric structural layer also exposes the MEMS diaphragm.

4. The MEMS device of claim 1, wherein the first dielectric structural layer wholly is a dielectric layer.

5. The MEMS device of claim 1, wherein the first dielectric structural layer also comprises a conductive structure in the first dielectric structural layer and surrounding each of the through holes in the supporting layer.

6. The MEMS device of claim 5, wherein the conductive structure comprises at least two vertical walls contacting on the supporting layer and at least a horizontal cap layer on a top of the vertical walls.

7. The MEMS device of claim 5, wherein the conductive structure is a ring bar and is embedded inside the first dielectric structural layer without contacting the supporting layer.

8. The MEMS device of claim 5, wherein the conductive structure comprises at least two vertical walls, a first horizontal layer on a top of the vertical walls, and a second horizontal layer on a bottom of the vertical walls.

9. The MEMS device of claim 1, further comprising an etching mask layer between the first dielectric structural layer and the second dielectric structural layer, wherein an etching rate of the etching mask layer is lower than a dielectric portion of the first dielectric structural layer and the second dielectric structural layer.

10. The MEMS device of claim 9, wherein the etching mask layer only disposed at a peripheral region of the diaphragm region, not surrounding the openings of the first dielectric structural layer.

11. The MEMS device of claim 9, wherein a portion of the etching mask layer remains on the first dielectric structural layer and surrounds each of the openings of the first dielectric structural layer.

12. The MEMS device of claim 9, wherein the first dielectric structural layer also comprises a conductive structure in the first dielectric structural layer and surrounding the through holes in the supporting layer.

13. The MEMS device of claim 12, wherein the conductive structure comprises at least two vertical walls contacting on the supporting layer and at least a horizontal cap layer on a top of the vertical walls.

14. The MEMS device of claim 12, wherein the conductive structure is a ring bar and is embedded inside the first dielectric structural layer without contacting the substrate.

15. The MEMS device of claim 12, wherein the conductive structure comprises at least two vertical walls, a first horizontal layer on a top of the vertical walls, and a second horizontal layer on a bottom of the vertical walls.

16. The MEMS device of claim 1, wherein the first dielectric structural layer is disposed on the supporting layer with direct contact.

17. A Micro-Electro-Mechanical Systems (MEMS) device, comprising:
   a substrate, having a diaphragm opening at a diaphragm region;
   a supporting layer being non-conductive, disposed over the substrate to cover the diaphragm opening, wherein a first side of the supporting layer is exposed to the diaphragm opening, wherein the supporting layer has a plurality of through holes within the diaphragm region, so that the through holes of the supporting layer are connected with the diaphragm opening;
   a first dielectric structural layer, disposed over a second side of the supporting layer, wherein the first dielectric structural layer has a plurality of openings corresponding to the through holes, wherein each of the through holes remains exposed by the first dielectric structural layer;
   a second dielectric structural layer with a chamber, disposed over the first dielectric structural layer, wherein the chamber exposes the openings of the first dielectric structural layer; and
   a MEMS diaphragm, embedded in the second dielectric structural layer above the chamber, wherein an air gap is formed between the supporting layer and the MEMS diaphragm.

18. The MEMS device of claim 17, wherein each one of the openings of the first dielectric structural layer has a slant sidewall, so that each one of the openings has a first aperture close to the substrate and a second aperture close to the second dielectric structural layer, the first aperture is wider than the second aperture.

19. The MEMS device of claim 17, wherein the chamber of the second dielectric structural layer also exposes the MEMS diaphragm.

20. The MEMS device of claim 17, wherein the first dielectric structural layer wholly is a dielectric layer.

21. The MEMS device of claim 17, wherein the first dielectric structural layer also comprises a conductive structure in the first dielectric structural layer and surrounding each of the through holes in the substrate.

22. The MEMS device of claim 21, wherein the conductive structure comprises at least two vertical walls contacting on the supporting layer and at least a horizontal cap layer on a top of the vertical walls.

23. The MEMS device of claim 21, wherein the conductive structure is a ring bar and is embedded inside the first dielectric structural layer without contacting the supporting layer.

24. The MEMS device of claim 21, wherein the conductive structure comprises at least two vertical walls, a first horizontal layer on a top of the vertical walls, and a second horizontal layer on a bottom of the vertical walls.

25. The MEMS device of claim 17, further comprising an etching mask layer between the first dielectric structural layer and the second dielectric structural layer, wherein an etching rate of the etching mask layer is lower than a dielectric portion of the first dielectric structural layer and the second dielectric structural layer.

26. The MEMS device of claim 25, wherein the etching mask layer only disposed at a peripheral region of the diaphragm region, not surrounding the openings of the first dielectric structural layer.

27. The MEMS device of claim 26, wherein a portion of the etching mask layer remains on the first dielectric structural layer and surrounds each of the openings of the first dielectric structural layer.

28. The MEMS device of claim 17, wherein the supporting layer is a rigid layer with an etching rate being sufficiently low capable of resisting dielectric etching for the MEMS device.

* * * * *